(12) United States Patent
Matsushita et al.

(10) Patent No.: US 7,495,181 B2
(45) Date of Patent: Feb. 24, 2009

(54) ELECTROMAGNETIC WAVE ABSORBER

(75) Inventors: Masato Matsushita, Yamatokooriyama (JP); Takahiko Yoshida, Yamatokooriyama (JP); Haruhide Go, Yamatokooriyama (JP); Yoshiharu Kiyohara, Yamatokooriyama (JP); Makoto Maezawa, Yamatokooriyama (JP); Shinichi Sato, Yamatokooriyama (JP)

(73) Assignee: Nitta Corporation, Osaka (JP)

( * ) Notice: Subject to any disclaimer, the term of this patent is extended or adjusted under 35 U.S.C. 154(b) by 132 days.

(21) Appl. No.: 11/664,101

(22) PCT Filed: Sep. 29, 2005

(86) PCT No.: PCT/JP2005/018036

§ 371 (c)(1),
(2), (4) Date: Mar. 29, 2007

(87) PCT Pub. No.: WO2006/035912

PCT Pub. Date: Apr. 6, 2006

(65) Prior Publication Data

US 2008/0257599 A1   Oct. 23, 2008

(30) Foreign Application Priority Data

Sep. 29, 2004  (JP) .............................. 2004-284968

(51) Int. Cl.
H05K 9/00 (2006.01)
H02B 1/015 (2006.01)
H01T 13/08 (2006.01)

(52) U.S. Cl. ...................... 174/377; 174/392
(58) Field of Classification Search ............ 174/350, 174/50, 377, 392, 261; 361/816, 818, 800
See application file for complete search history.

(56) References Cited

U.S. PATENT DOCUMENTS 5,453,328 A    9/1995   Nagano et al.

(Continued)

FOREIGN PATENT DOCUMENTS

JP          06-140787         5/1994

(Continued)

OTHER PUBLICATIONS

International Search Report (PCT/ISA/210).

(Continued)

*Primary Examiner*—Hung V Ngo
(74) *Attorney, Agent, or Firm*—Harness, Dickey & Pierce, P.L.C.

(57) ABSTRACT

A conductive pattern basically has a substantially polygonal outline shape which is a polygon and can have a high peak value of the electromagnetic wave absorption amount as compared to a case when the conductive pattern has a circular outline shape. Thus, the conductive pattern is basically a polygon and at least one corner portion is shaped in curve. This reduces or even minimizes the shift of the frequency at which the absorption amount becomes a peak value by the polarization direction of the electromagnetic wave. Accordingly, in at least one embodiment, it is possible to realize an electromagnetic absorber having an excellent electromagnetic wave absorption characteristic exhibiting a high peak value of the absorption amount of the electromagnetic wave and a small shift of frequency at which the absorption amount becomes a peak value by the polarization direction of the electromagnetic wave.

18 Claims, 21 Drawing Sheets

U.S. PATENT DOCUMENTS

| | | | |
|---|---|---|---|
| 5,455,116 A | 10/1995 | Nagano et al. | |
| 5,455,117 A * | 10/1995 | Nagano et al. | 428/545 |
| 6,949,707 B1 * | 9/2005 | Tonomura | 174/390 |
| 2003/0010529 A1 * | 1/2003 | Sievenpiper et al. | 174/255 |
| 2005/0016746 A1 * | 1/2005 | Sze et al. | 174/35 R |

FOREIGN PATENT DOCUMENTS

| | | |
|---|---|---|
| JP | 06-244583 | 9/1994 |
| JP | 07-283578 | 10/1995 |
| JP | 9-307267 | 11/1997 |
| JP | 11-054981 | 2/1999 |
| JP | 11-204984 | 7/1999 |
| JP | 2002-76670 | 3/2002 |
| JP | 2002-246786 | 8/2002 |
| JP | 2003-69278 | 3/2003 |
| JP | 2003-163487 | 6/2003 |
| JP | 2003-243876 | 8/2003 |
| JP | 2004-063719 | 2/2004 |
| JP | 2004-193531 | 7/2004 |
| JP | 2004-259910 | 9/2004 |
| JP | 2005-12204 | 1/2005 |
| JP | 2005-244043 | 9/2005 |
| JP | 2005-277373 | 10/2005 |
| JP | 2005-288969 | 10/2005 |

OTHER PUBLICATIONS

International Preliminary Examination Report (IPER) for International Application No. PCT/JP2005/018036 dated Jun. 28, 2007. PCT/ISA/210.

* cited by examiner

SQUARE PATTERN 0°

SQUARE PATTERN 45°

CIRCULAR PATTERN

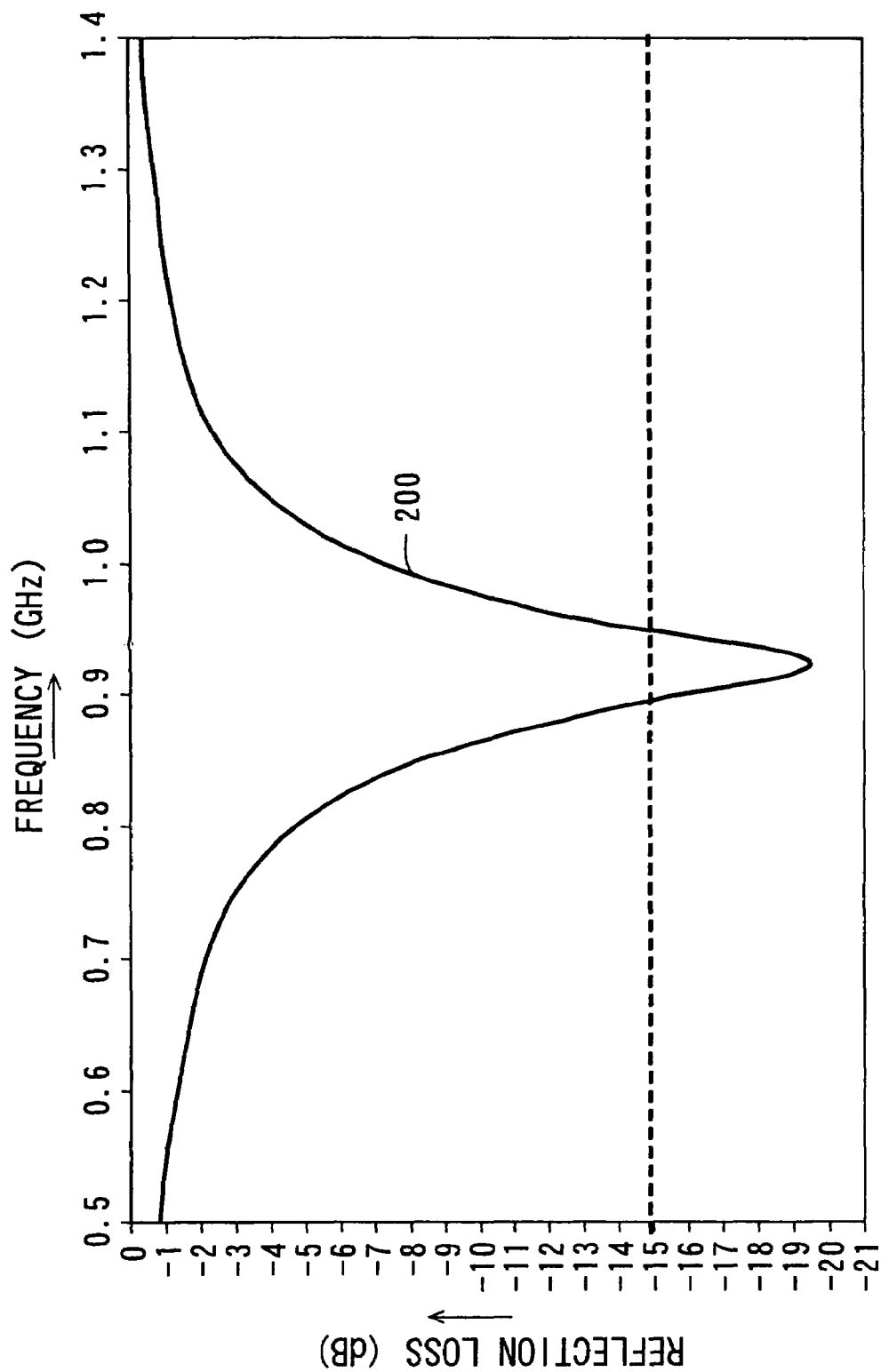

ELECTROMAGNETIC WAVE ABSORBER

TECHNICAL FIELD

The present invention relates to an electromagnetic wave absorber that catches an electromagnetic wave and absorbs it.

BACKGROUND ART

When a LAN (Local Area Network) of a computer network is set up, a wireless LAN that uses microwaves is utilized and thereby a communication system more flexible and higher in the mobility is set up. Furthermore, a communication service that communicates by wireless between a wide network system or an exchange network called FWA (Fixed Wireless Access) and communication apparatus that a user operates has started. That is, a wireless communication system is being utilized more and more familiarly. Still furthermore, a short distance wireless technology called Bluetooth representative of a WPAN (Wireless Personal Area Network) is utilized as an alternative technology of a wire/cable technology. In years to come, a communication system that uses a portable telephone that can verbally communicate due to a wireless LAN called a VoWLAN (Voice over Wireless Local Area Network) as well is expected to prevail.

When a plurality of wireless LAN systems is set up in close vicinity each other or in an environment where a wireless LAN is set up a microwave oven or an antitheft security system that utilizes a wireless communication technology is used, as the result of usage of electromagnetic waves in the same frequency band, a problem of electromagnetic wave interference (interference with other wavelength) may be caused. Separately therefrom, a problem of an error in transmission due to a reflection wave (problem of multipath, self-interference) may be caused. Specifically, the deterioration in a transmission speed between units that make use of the wireless technology and an increase in a BER (Bit Error Rate), that is, the deterioration of a communication environment is caused. There is concern over adverse affect on electronic units as well, and, in the worst case, a device may malfunction. In order to overcome the problems, an electromagnetic wave absorber (hereinafter, in some cases, referred to as "pattern electromagnetic wave absorber") provided with a pattern layer having a conductive pattern (hereinafter, in some cases, simply referred to as "pattern") is in use.

The pattern electromagnetic wave absorber is disclosed in, for instance, Japanese Patent No. 3076473 (Japanese Unexamined Patent Publication JP-A 6-244583 (1994)), Japanese Patent No. 3209456 (Japanese Unexamined Patent Publication JP-A 6-140787 (1994)), Japanese Unexamined Patent Publications JP-A 11-204984 (1999) and JP-A 2002-246786. In particular, in JP-A 2002-246786, an electromagnetic wave absorber having a pattern layer excellent in the grazing incidence characteristics is disclosed. Furthermore, in JP-A 11-204984, there is a description of a plurality of resonant frequency-selective electromagnetic wave shielding planar bodies and this relates to an electromagnetic wave absorber having a pattern layer having a bimodal characteristics. Pattern shapes used in the electromagnetic wave absorbers disclosed in the respective patent literatures are polygonal or circular and linear or planar shapes. There is found no literature that studies of an influence of a polarized wave of electromagnetic wave on the electromagnetic wave absorption characteristics.

A pattern electromagnetic wave absorber works as a receiving antenna corresponding to an electromagnetic wave of a frequency of which pattern is absorbed to capture the electromagnetic wave and the captured electromagnetic wave is interfered by the pattern and a loss layer so as to attenuate or cancel out the electromagnetic wave to make a reflected wave smaller. Such a pattern electromagnetic wave absorber realizes a thin electromagnetic wave absorber that is tuned so as to resonate with an electromagnetic wave of a frequency to be absorbed.

In the pattern electromagnetic wave absorber, a dimension of a pattern is appropriately set so that a reflection amount of an electromagnetic wave of a frequency to be absorbed may be smaller. However, when the polarization dependency of the pattern is large, it becomes difficult to make correspond to an electromagnetic wave of a frequency to be absorbed. That is, there is a problem in that, owing to a shape of a pattern, depending on a TE wave, TM wave, an electromagnetic wave entering from an arbitrary angle therebetween or a circularly polarized wave, the electromagnetic wave absorption characteristics, in particular, an absorption frequency varies, accordingly a problem in that the electromagnetic wave absorption characteristics have the polarization dependency.

The reason for this is in that, since the pattern electromagnetic wave absorber, involving parameters including a shape, number and arrangement of patterns, a dimension of a loss layer and material constants ($\in'$, $\in''$, $\mu'$, $\mu''$), creates the optimum state and thereby realizes a high performance thin electromagnetic wave absorber, the optimum design of the absorption characteristics to a normally entering electromagnetic wave is established; however, depending on an incident angle of the electromagnetic wave or the polarization, the resonant state is readily affected to vary a resonant frequency.

DISCLOSURE OF THE INVENTION

An object of the invention is to provide an electromagnetic wave absorber that has high peak value of absorption amount of an electromagnetic wave or is capable of absorbing electromagnetic waves of a plurality of frequencies, and is small in displacement between frequencies where peaks of absorption amount are reached, which displacement is caused by difference of polarization directions of electromagnetic waves.

The invention provides an electromagnetic wave absorber comprising:

a pattern layer in which a plurality of pieces of conductive patterns including a single or plurality of kinds of conductive patterns having a substantially polygonal outline shape in which at least one corner portion is shaped in curve is formed in a mode where the plurality of conductive patterns are separated from each others; and a loss layer having a portion made of at least one material of a magnetic loss material having complex specific magnetic permeability ($\mu'$, $\mu''$) and a dielectric loss material having complex specific permittivity ($\in'\in''$), wherein the pattern layer and the loss layer are laminated on each other, and a portion that is formed in curve in the corner portion is formed with a dimension in which frequencies where peaks of absorption amount are reached are fixed regardless of an angle position relationship of the conductive pattern with respect to a polarization direction as viewed from an incident direction of electromagnetic direction, the dimension being small.

Furthermore, in the invention, it is preferable that a dimension of a portion that is formed in curve in the corner portion is determined at a small dimension within the range of dimension that can suppress displacement of frequency of electromagnetic wave which can be absorbed due to the difference of the polarization direction.

Furthermore, in the invention, it is preferable that the outline shape is a shape formed by a combination of a straight line and a curve.

Furthermore, in the invention, it is preferable that the substantially polygonal shape is a shape in which four corner portions of a square are formed in an arc shape.

Still furthermore, in the invention, it is preferable that the conductive pattern is a planar pattern.

Furthermore, in the invention, it is preferable that conductive patterns different in outer peripheral length are combined to form.

Still furthermore, in the invention, it is preferable that conductive patterns different in curvature radius at corner portions are combined to form.

In the invention, it is preferable that a separation between two adjacent conductive patterns is different depending on a position.

Furthermore, in the invention, it is preferable that the conductive pattern has a single or plurality of void portions and the void portions resonate with an electromagnetic wave of a frequency to be absorbed.

Still furthermore, in the invention, it is preferable that the loss layer includes:

an electromagnetic wave absorbing layer made of a material that is at least either a magnetic loss material or a dielectric loss material; and a dielectric layer made of a dielectric material.

In the invention, it is preferable that the electromagnetic wave absorbing layer includes as a magnetic loss material at least one selected from a group consisting of ferrite, iron alloy and iron powder at a blending ratio of 1 parts by weight or more and 1500 parts by weight or less to 100 parts by weight of an organic polymer.

Furthermore, in the invention, it is preferable that a real part $\mu'$ of the complex specific permittivity of the dielectric layer is in the range of 1 or more and 50 or less.

Still furthermore, in the invention, it is preferable that the electromagnetic wave absorbing layer and the dielectric layer, respectively, are $10^6$ Ω/square or more in the surface resistivity.

Furthermore, in the invention, it is preferable that at least either the electromagnetic wave absorbing layer or the dielectric layer is obtained by laminating a plurality of layers.

Still furthermore, in the invention, it is preferable that the electromagnetic wave absorber is an electromagnetic wave absorber for absorbing an electromagnetic wave of 2.4-GHz band, and a total thickness of the electromagnetic wave absorber is 4 mm or less.

Still furthermore, in the invention, it is preferable that the electromagnetic wave absorber is an electromagnetic wave absorber for absorbing an electromagnetic wave of 900-MHz band, and a total thickness of the electromagnetic wave absorber is 10 mm or less.

Furthermore, in the invention, it is preferable that a conductive reflective layer is laminated on a side opposite to the pattern layer with respective to the loss layer.

Still furthermore, in the invention, it is preferable that the electromagnetic wave absorber is flame resistant and non-flammable.

The invention provides an electromagnetic wave absorbing method that uses any one of the electromagnetic wave absorbers mentioned above.

BRIEF DESCRIPTION OF DRAWINGS

Other and further objects, features, and advantages of the invention will be more explicit from the following detailed description taken with reference to the drawings wherein:

FIG. 22 is a graph showing simulation results of an electromagnetic wave absorber having an absorption peak in a 900-MHz band as an example of the invention.

BEST MODE FOR CARRYING OUT THE INVENTION

Figure 1A:
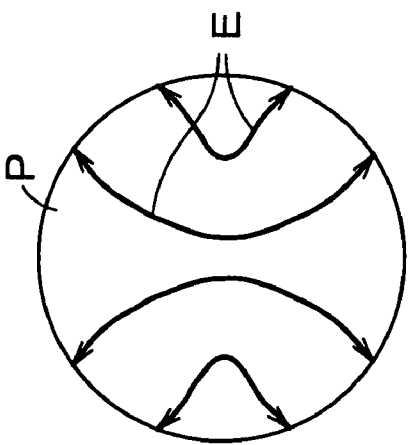
FIG. 1 is a front view showing a pattern P for explaining a direction in which an electric field is generated depending on an angle of a square pattern when an electromagnetic wave is irradiated.

Now referring to the drawings, preferred embodiments of the invention are described below.

Figure 1B:
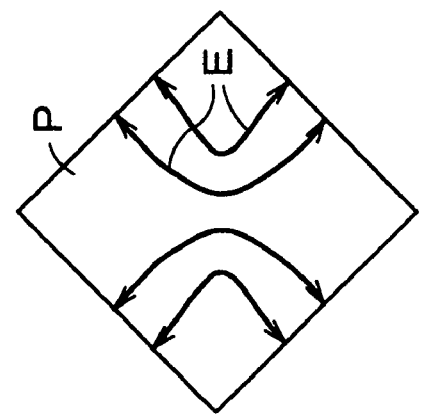
Figure 1C:
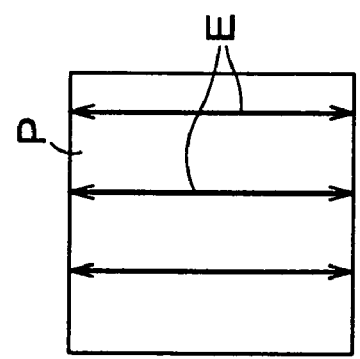

FIG. 1 is a front view of a pattern P showing an influence that a direction of the pattern P affects on an electric field generated in the pattern P when in the pattern P an electromagnetic wave that is a TE wave is received. FIG. 1A shows how an electric field is generated when a square pattern P is placed in such a positional relationship that two sides thereof are in parallel with a direction of an electric field in an electromagnetic wave (hereinafter, in some cases, referred to as "polarization direction"), FIG. 1B shows how an electric field is generated when a pattern P is displaced by 45° from the positional relationship of FIG. 1 and FIG. 1C shows how an electric field is generated in a case of a circular pattern P. The positional relationship of FIG. 1A is a positional relationship of a square pattern P having sides in parallel with or vertical to a direction of an electric field of an electromagnetic wave. The positional relationship in FIG. 1B is a positional relationship where a square conductive pattern P is displaced by 45° from a position of FIG. 1A. The square means a quadrangle of which four inner angles are right angles. The respective patterns P in FIG. 1 are conductive patterns.

As shown in FIG. 1, when an electromagnetic wave is received by a pattern P, a direction E of an electric field generated in the pattern P is different depending on a shape of the pattern P, and, in the case of the square pattern P, is different as well depending on the positional relationship of the pattern P to the polarization direction of an electromagnetic wave. In the case of FIG. 1A, a direction E of an electric field generated in the pattern P is a linear direction in parallel with one side. In the cases of FIGS. 1B and 1C, a direction E of an electric field generated in the pattern P becomes substantially hyperbolic.

When a direction E of a generated electric field is thus varied, a resonant frequency with an electromagnetic wave is varied. In the square pattern P, in the case of an electromagnetic wave, in particular, a TE wave and a TM wave being received, when a position of FIG. 1A is taken, a resonant current tends to flow along a side in the neighborhood of a side. On the other hand, in the cases of FIG. 1B where the square pattern P is displaced by 45° from FIG. 1A and FIG. 1C where a circular pattern P is used, it is shown that, in comparison with the case where the square pattern P is used as shown in FIG. 1A, a resonant current cannot be concentrated in the neighborhood of a side. Accordingly, as a pattern that is used to receive an electromagnetic wave, there are conductive patterns such as a circular pattern where irrespective of the polarization direction of an electromagnetic wave a receiving state is constant and a square pattern where depending on the polarization direction of an electromagnetic wave a receiving state is varied. In an actual usage environment of an electromagnetic wave absorber, not only linearly polarized electromagnetic waves such as the TE wave and TM wave but also a circularly polarized electromagnetic wave are present, and furthermore, even in electromagnetic waves that are linearly polarized electromagnetic waves, the polarization directions are not necessarily same. Accordingly, since electromagnetic waves where electromagnetic waves different in the polarization direction are mixed have to be absorbed, it becomes a very important problem to suppress the polarization dependency where a receiving state is different dependent on the polarization direction like this, that is, to improve the polarization dependency. The invention can overcome the problem.

Furthermore, in an electromagnetic wave absorber that receives an electromagnetic wave with a conductive pattern and makes energy lose in a loss layer, when tendency of the electromagnetic wave absorption characteristics caused by a shape of the conductive pattern are analyzed, an improvement in an amount of the electromagnetic wave absorption and an improvement in the polarization characteristics that reduce the polarization dependency are not compatible but rather contradict to each other. When a shape of the conductive pattern is polygonal, irrespective of being linear or planar, in the case of an outline shape of the conductive pattern having a sharp corner portion called an edge, although a peak value of an absorption amount of the electromagnetic wave becomes higher, a displacement of a frequency where an absorption amount becomes a peak value due to a direction of an electric field of an electromagnetic wave becomes larger. Furthermore, when a shape of the conductive pattern is circular, irrespective of being linear or planar, although a frequency where an absorption amount becomes a peak due to the polarization direction of an electromagnetic wave is not displaced, a peak value of an absorption amount of an electromagnetic wave becomes lower.

A conductive pattern having a sharp corner portion such as a polygon or the like is higher in the Q value than a circular conductive pattern. The Q value can be expressed with a resonant frequency and a bandwidth and Q=resonant frequency/bandwidth. The bandwidth is a width of a band that has a receiving intensity equal to or more than a half a predetermined receiving intensity, for instance, a receiving intensity at a resonant frequency $\omega 0$. Accordingly, with the resonant frequency $\omega 0$, when frequencies on both sides sandwiching the resonant frequency where the receiving intensity becomes one half a receiving intensity at the resonant frequency $\omega 0$ are expressed by $\omega 1$ and $\omega 2$ ($>\omega 2$), respectively, $Q=\omega 0/(\omega 2-\omega 1)$.

Since the Q value expresses the electromagnetic wave absorption characteristics of a pattern electromagnetic wave absorber, it can be expressed with applied to a peak value of an amount of electromagnetic wave absorption. That the Q value is high expresses that although a width of a frequency band (hereinafter, in some cases, referred to as "absorption band") of an electromagnetic wave that is absorbed is small, the electromagnetic wave absorption amount (hereinafter, in some cases, simply referred to as "absorption amount") has a high peak value. Furthermore, that the Q value is small means that although a peak value of an absorption amount is small, the absorption band has a large width. An absorption band is a frequency of an electromagnetic wave that is absorbed at an absorption amount equal to or more than a predetermined absorption amount.

A conductive pattern having a sharp corner portion, being high in the Q value, has a high peak value of an absorption amount; however, a width of an absorption band becomes narrower to generate a displacement in the resonant frequency depending on difference of the polarization direction. This is obvious from that, while, in the case of FIG. 1A, a strong current is generated along a side of the pattern P to cause there the resonation, in the cases of FIGS. 1B and 1C, a phenomenon where a passage through which a strong current flows is not concentrated along a side in comparison with the case of FIG. 1A is caused. In other words, when a current passage is expanded, a region where a wave of a half wavelength involving the resonation distributes is expanded and thereby resonant conditions are increased. As the result, a width of an absorption band becomes larger. In the case of a square conductive pattern, when an arrangement as shown in FIG. 1A is taken, an electric field is generated in a straight direction in parallel with a side. However, when the pattern is displaced through 45° as shown in FIG. 1B, since an electric field in a direction depicting an arc is generated, it is obvious that a distribution is different. That is, in a configuration that uses a square conductive pattern, the resonation is caused concentrated and thereby the absorption characteristics of the electromagnetic wave become higher; however, there is the polarization dependency. Without restricting to the square, a configuration that uses a polygonal conductive pattern has such characteristics.

In the embodiment, a shape of a conductive pattern is optimized, and thereby an excellent pattern electromagnetic wave absorber that is small in the polarization dependency and can heighten an electromagnetic wave absorption amount is provided. The pattern electromagnetic wave absorber is an electromagnetic wave absorber provided with a pattern layer having a conductive pattern. In order to improve the foregoing defects when a polygonal conductive pattern is used, a shape of the conductive pattern is fundamentally polygonal; however, at least one corner portion thereof is formed in curve. An advantage of imparting R to a corner portion, that is, forming in curve is to make a resonant current flow easily without staying at a corner portion and furthermore to expand a resonant region; as the result, although the Q value is a little deteriorated, broad band performance is obtained to improve the polarization characteristics.

Thereby, a displacement of a frequency where an absorption amount becomes a peak value depending on a polarization direction of the electromagnetic wave can be suppressed small. Accordingly, an electromagnetic wave absorber that is high in a peak value of an absorption amount of an electromagnetic wave and small in the displacement of the frequency where an absorption amount becomes a peak value depending on the polarization direction of the electromagnetic wave, that is, excellent in the electromagnetic wave absorption characteristics can be realized.

Figure 2:
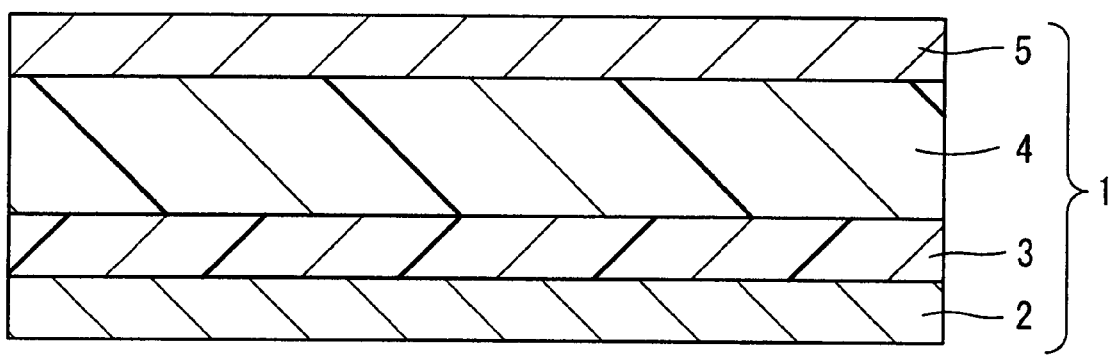
FIG. 2 is a sectional view of an electromagnetic wave absorber 1 of an embodiment of the invention.

FIG. 2 is a sectional view of an electromagnetic wave absorber 1 of an embodiment of the invention. For instance, in an electromagnetic wave absorber 1 that improves an electromagnetic wave environment of a space such as an office, from an electromagnetic wave incident side that is an upper side in FIG. 2, a pattern layer 5, an electromagnetic wave absorbing layer 4, a dielectric layer 3 and a conductive reflective layer 2 are laminated in this order. The pattern layer 5 has a plurality of conductive patterns 12. The conductive pattern 12, depending on shapes of the respective patterns 30 and 31 contained in the conductive pattern 12, can control a matching frequency. The electromagnetic wave absorber 1 is used to absorb, for instance, an electromagnetic wave of 2.4 GHz or 5.2 GHz.

Figure 3:
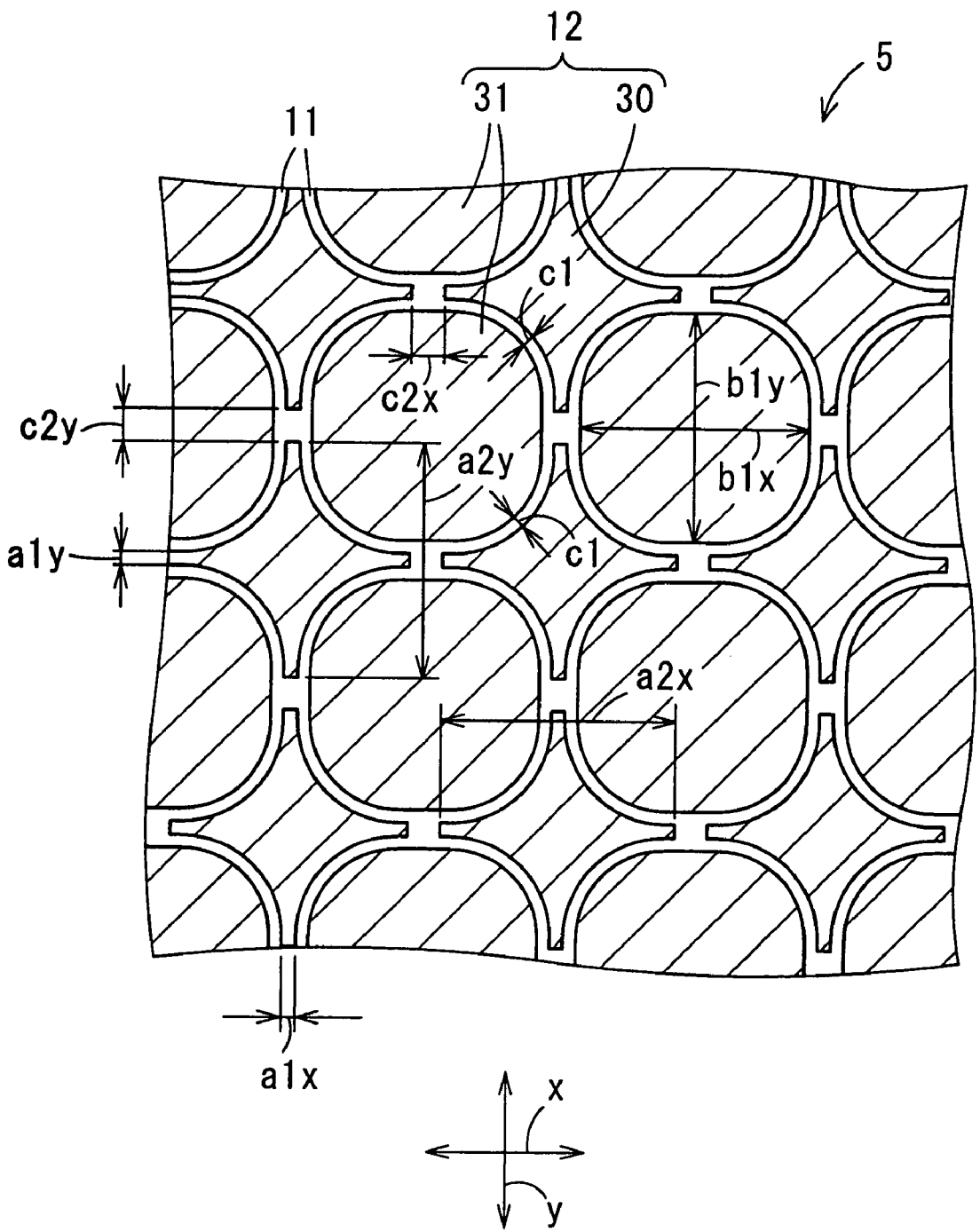
FIG. 3 is a front view showing a pattern layer 5 that constitutes an electromagnetic wave absorber 1 of an embodiment of the invention shown in FIG. 2.
Figure 4:
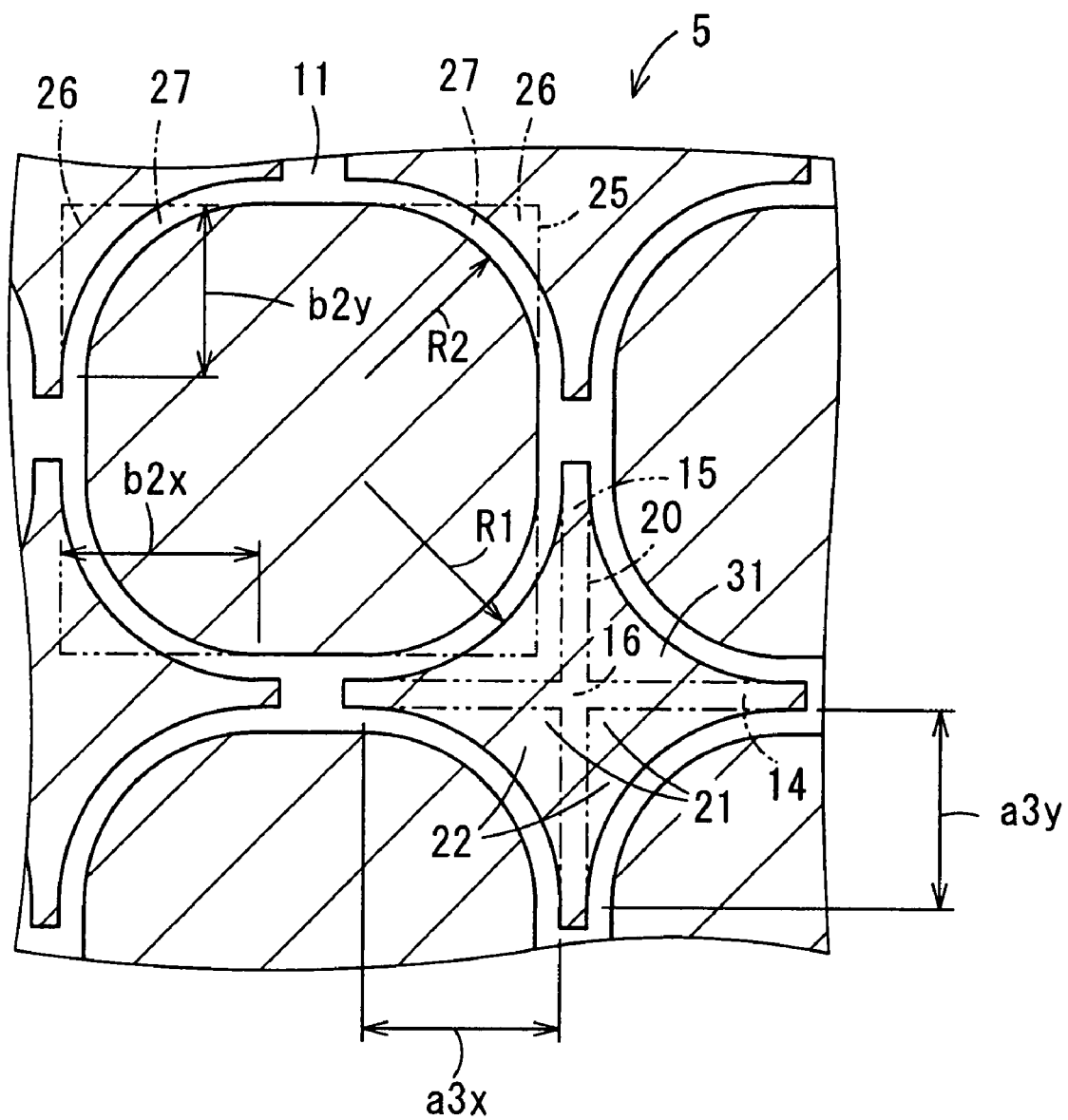
FIG. 4 is a front view showing by partially expanding a pattern layer 5 in an embodiment shown in FIGS. 2 and 3.

FIG. 3 is a front view showing a pattern layer 5 that constitutes an electromagnetic wave absorber 1 of an embodiment of the invention shown in FIG. 2. FIG. 4 is a front view obtained by partially expanding a pattern layer 5 in an embodiment shown in FIGS. 2 and 3.

In the pattern layer 5, on a surface on an electromagnetic wave incident side of a planar substrate 11, a conductive pattern 12 is formed. The planar substrate 11 is made of a dielectric that is for instance a synthetic resin and the planar substrate 11 as well is a dielectric loss material. The conductive pattern 12 has a radial pattern 30 and a substantially square pattern 31.

The radial pattern 30 is formed in a radial shape and a plurality of radial patterns 30 are disposed separated from each other with separations (hereinafter, referred to as "radial pattern separation") $c2x$ and $c2y$. More specifically stated, for instance, in the embodiment, the radial pattern 30 is formed in a cross shape that is radial along an x direction and a y direction that are perpendicular to each other and the radial patterns 30 may be regularly arranged in matrix with a radial pattern separation $c2x$ disposed in an x direction and a radial pattern separation $c2y$ disposed in a y direction.

The radial pattern 30 has a shape where with a cross shape 20 shown with a virtual line in FIG. 4 as a basis, four corner portions 21 at an intersection 16 are formed in curve, specifically, in arc. The cross shape 20 that is a basis has a shape where a rectangular portion 14 slenderly extending in an x direction and a rectangular portion 15 slenderly extending in a y direction intersect at a right angle at the intersection 16 with gravity centers of the respective shape portions 14 and 15 superposed. The respective shape portions 14 and 15 are displaced by 90° from each other around a vertical axial line at the intersection 16 and have the same shape. To such a cross shape 20, four substantial triangles 22 each of which is a rectangular isosceles triangle and has a hypotenuse facing a right angle corner portion and concave toward the right angle corner portion are disposed so that the right angle corner portion may be accommodated in a corner portion 21 of the respective intersections 16 of the cross shape 20.

When a frequency of an electromagnetic wave to be absorbed is 2.4 GHz, in one example of a dimension of the radial pattern 30, widths $a1x$ and $a1y$ of the respective shape portions 14 and 15 are equal, for instance, 1.0 mm, and lengths $a2x$ and $a2y$ of the respective shape portions 14 and 15 are equal, for instance, 25.0 mm. A dimension to be an arc of a corner portion formed in arc, accordingly, lengths of sides excluding a hypotenuse of a substantial triangle 22, specifically, a length $a3x$ of a side in an x direction and a length $a3y$ of a side in a y direction are same, for instance, 11.5 mm, and a curvature radius R1 of the hypotenuse is 11.5 mm. As to separations between radial patterns, a separation $c2x$ in an x direction and a separation $c2y$ in a y direction are same, and, for instance, 4.0 mm.

The substantially square pattern 31 is disposed in a region surrounded by radial patterns 30 with a separation (hereinafter, referred to as "radial-square separation" $c1$ distanced from the radial pattern 30 so as to fill in the region surrounded by the radial patterns 30. In more detail, the substantially square pattern 31 is formed into a shape corresponding to the region surrounded by radial pattern portions. More specifically, in the embodiment for instance, the radial pattern portion 30 is formed in cross as mentioned above, the region surrounded by the radial patterns 30 is a substantial rectangle with a rectangle as a basis, and a shape corresponding thereto, that is, a radial-square separation $c1$ is formed in the same shape over an entire circumference. When the respective shape portions 14 and 15 are formed in the same shape as mentioned above, the region surrounded by the radial patterns 30 becomes a substantial square with a square as a basis, and the substantial square pattern 31 becomes a substantial square with a square 25 a basis. In the substantial square pattern 31, side portions of the square 25 that becomes a basis are disposed extended in either one of an x direction and a y direction.

The substantial square pattern 31 has a shape where with a square 25 as a basis four corner portions 26 are formed in curve, specifically, in arc. Specifically, the substantial square pattern 31 has a shape where from the square 25 four substantial triangles 27 that are rectangular isosceles triangles and where a hypotenuse facing a right-angled corner portion is formed in arc concave toward the right-angled corner portion are removed with a positional relationship so that the right-angled corner portion may be housed in the respective corner portions 26 of the square.

When a frequency of an electromagnetic wave to be absorbed is 2.4 GHz, as an example of dimensions of the substantial square pattern 31, a dimension b1$x$ in an x direction and a dimension b1$y$ in a y direction of the square 25 are same and, for instance, 25.0 mm. A dimension to be an arc at a corner portion that is formed in arc, accordingly, lengths of sides excluding a hypotenuse of the substantial triangle 27, specifically, a length b2$x$ of a side in an x direction and a length b2$y$ of a side in a y direction are same and, for instance, 10.0 mm, and a curvature radius R2 of the hypotenuse is 10.0 mm. As to the radial-square separation, a separation c1$x$ in an x direction and a separation c1$y$ in a y direction are same, and, for instance, 4.0 mm.

Such radial pattern 30 and substantial square pattern 31 are conductive patterns having a substantial polygonal outline shape in which with a substantial polygon as a basis at least one corner portion is formed in curve. In such a pattern, a resonant current when an electromagnetic wave is received flows smoothly in a corner portion formed in curve.

Furthermore, the radial pattern 30 and substantial square pattern 31 are not formed in line (in band) of a closed loop extending along an external peripheral border of the shape but are planar patterns of which internal peripheral portion is filled in. Accordingly, each of these can form a capacitor with the conductive reflective layer 2.

In such an electromagnetic wave absorber 1, the pattern layer 5 can efficiently receives electromagnetic waves having resonant frequencies of the respective conductive patterns 12. However, the final resonant frequency is determined influenced not only by the pattern dimension but also by the impedance that is determined from the coupling characteristics between the conductive patterns 12, the electromagnetic wave absorbing layer 4 and the dielectric layer 3. In the close proximity of the pattern layer 5, the electromagnetic wave absorbing layer 4 and the dielectric layer 3 are disposed; accordingly, energy of the electromagnetic wave received by the pattern layer 5 is lost. In other words, energy of the electromagnetic wave, after converting into thermal energy, can be absorbed. When such the pattern layer 5 is used, the electromagnetic wave can be efficiently received and absorbed.

The electromagnetic wave absorbing layer 4 is formed of a material that is at least one of a magnetic loss material having the complex specific permeability ($\mu'$, $\mu''$) and a dielectric loss material having the complex specific permittivity ($\in'$, $\in''$). The dielectric layer 3 is made of a dielectric loss material having the complex specific permittivity ($\in'$, $\in''$). The conductive reflective layer 2 is formed on a surface on an incidence side of the electromagnetic wave of the planar substrate with a conductive film formed over an entire surface. The electromagnetic wave absorber 1 receives by the respective conductive patterns 12 of the pattern layer 5 electromagnetic waves of resonant frequencies determined by the shape and dimension thereof, and, allows losing the electromagnetic wave energy in the electromagnetic wave absorbing layer 4 and a loss layer including the dielectric layer 3, specifically, converts into thermal energy followed by absorbing. The electromagnetic wave absorber 1 can be formed as well without the dielectric layer 3.

When the electromagnetic wave absorber 1 is formed in a laminate configuration such as mentioned above, the absorption efficiency of the electromagnetic wave can be heightened and thereby the electromagnetic wave absorption characteristics large in the electromagnetic wave absorption amount can be obtained. Accordingly, the electromagnetic wave absorber 1 can achieve thinning and weight saving. In comparison with a configuration that absorbs an electromagnetic wave of, for instance, 2.45 GHz, the electromagnetic wave absorber 1 can realize the thinning where a thickness is suppressed to substantially ⅓ to substantially ¼ that of a λ/4 electromagnetic wave absorber, the thinning where a thickness is suppressed to substantially ½ that of a single layer electromagnetic wave absorber that uses rubber ferrite or the like, and the weight saving where a weight is suppressed to substantially ¼. Furthermore, when the conductive pattern 12 is formed in planar pattern to form a capacitor with the conductive reflective layer 2 to make the capacitance larger, the receiving efficiency can be made higher and the electromagnetic wave absorption efficiency can be heightened.

Furthermore, the electromagnetic wave absorber 1 is constituted disposed with a conductive reflective plate 2 as an electromagnetic wave shield plate. When the conductive reflective plate 2 is not provided, the electromagnetic wave absorber 1 is constituted so as to dispose on a surface of an object having the electromagnetic wave shielding properties. Thereby, determination of a shape and a dimension of the pattern shape 5, that is, designing becomes easy. In this case, in a configuration where the conductive reflective plate 2 is used, resonant frequencies of the conductive patterns 12, 30 and 31 can be inhibited from varying under an influence of a disposition place of the electromagnetic wave absorber 1. For instance, when the electromagnetic wave absorber 1 (of configuration in which a conductive reflective plate 2 is not laminated) is disposed on a building internal material that is not conductive, under influence of intrinsic complex specific permittivity of the internal material, a resonant frequency of the pattern (antenna) may be varied; however, this can be inhibited from occurring.

Still furthermore, in the conductive pattern 12, the radial patterns 30 are disposed so as to confront radially extended portions each other as mentioned above, and the substantially square pattern 31 is formed in a shape corresponding to a region surrounded by the radial patterns 30. Such an arrangement is a combination where the radiant pattern 30 and the square pattern 31 that are different in the reception principle (a radial pattern is a dipole antenna and a square pattern is a patch antenna) are combined to optimize (become heighten) the reception efficiency. Accordingly, an electromagnetic wave absorber high in the absorption efficiency can be realized. Furthermore, the radial pattern 30 is disposed so as to radiate along an x direction and a y direction and side portions of a square that is a basis of the substantial square pattern 31 are disposed so as to extend in a x direction and a y direction; accordingly, electromagnetic waves polarized so that directions of electric fields may be present in a x direction and a y direction can be made higher in the receiving efficiency.

In the electromagnetic wave absorber 1, the conductive pattern 12 that receives an electromagnetic wave has a substantial polygonal outline shape that is fundamentally a polygon and a peak value of an absorption amount of the electromagnetic wave can be made higher than that of a case where an outline shape of a conductive pattern is a circle. Thus, the conductive pattern 12 is formed fundamentally in a polygon with at least one corner portion thereof formed in curve. Thereby, a displacement of a frequency where an absorption amount becomes a peak depending on the polarization direction of an electromagnetic wave can be suppressed smaller. Accordingly, excellent electromagnetic wave absorption characteristics where a peak value of an absorption amount of the electromagnetic wave is high and a displacement of a frequency where an absorption amount of the electromagnetic wave becomes a peak value depending on the polarization direction of the electromagnetic wave is small can be obtained.

Like this, in the electromagnetic wave absorber 1 of the embodiment, the conductive pattern 12 of the pattern layer 5 receives an electromagnetic wave having a particular frequency according to a resonation principle of antenna. In other words, the electromagnetic wave absorber of the invention, in addition to absorbing the electromagnetic wave, has a function where the conductive pattern 12 effectively works, in a state where a metal (conductive reflective layer 2) is present in the vicinity thereof, as a receiving antenna as well. Here, the particular frequency is a frequency determined by various elements such as a shape and a dimension of the conductive pattern 12 and a frequency to be absorbed by the electromagnetic wave absorber 1. When an electromagnetic wave is received by the conductive pattern 12, a resonant current flows at an edge portion of the conductive pattern 12. When the current flows, a magnetic field is generated around the current. The magnetic flux density distributes in such a state that the closer to the current the magnetic flux is, the larger the magnetic flux density is. When a loss layer having a magnetic loss material is disposed in the vicinity of the pattern layer 5, a magnetic field can be energetically lost. Thus, electromagnetic wave energy can be converted into thermal energy to absorb. In the embodiment, the loss layer includes the electromagnetic wave absorbing layer 4 and the dielectric layer 3.

Furthermore, when the electromagnetic wave absorber 1 is mounted on an object a surface portion of which is made of a conductive material to use, or when a conductive reflective layer is further disposed on a side opposite to the pattern layer 5 with respect to the loss layer to use in a laminated state through a loss layer between the pattern layer and a conductive layer, a capacitor can be formed between the conductive pattern 12 of the pattern layer 5 and the conductive layer (a superficial layer or a conductive reflective layer of an object made of a conductive material). When a distance between the conductive pattern 12 and the conductive layer is made shorter, the capacitance of the capacitor can be made larger. Furthermore, between patterns each other as well, a capacitor can be formed. Thus, in the pattern electromagnetic wave absorber, when a capacitor is utilized to impart a reactance control function, the thinning can be achieved.

Figure 5:
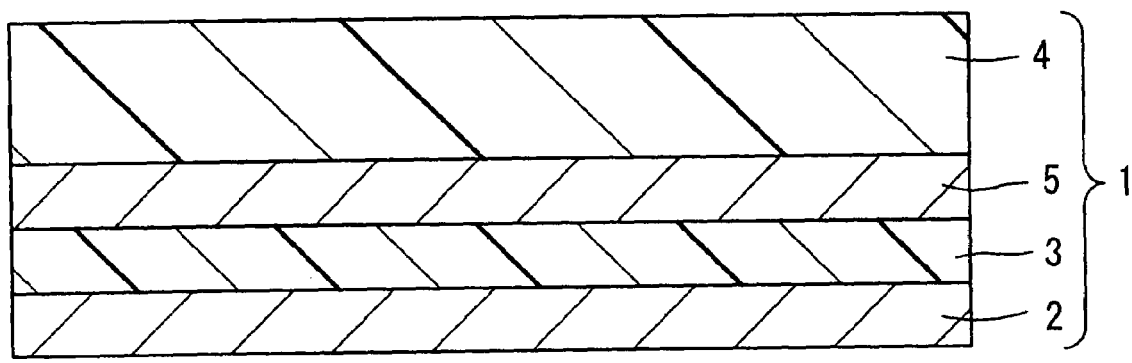
FIG. 5 is a sectional view of an electromagnetic wave absorber 1 of another embodiment of the invention.

FIG. 5 is a sectional view of an electromagnetic wave absorber 1 according to another embodiment of the invention. In the embodiment, similarly to the respective embodiments of the FIGS. 2 through 4, corresponding portions are shown with same reference numerals. In particular, in the embodiment, from an electromagnetic wave incidence side, an electromagnetic wave absorbing layer 4, a pattern layer 5, a dielectric layer 3 and a conductive reflective layer 2 are laminated in this order. Other configurations are same as that of the foregoing embodiment.

In calculating an absorption amount of electromagnetic wave (amount of reflection loss) in the invention, the computer simulation is carried out. In the simulation, by use of a TLM method, "Micro-Stripes" (trade name, produced by KCC Corporation) is used. In calculating, material constants at 2.4 GHz for instance of an electromagnetic wave absorbing layer 4 are set in such a manner that a real part of the complex specific permittivity $\in'$=12.2, an imaginary part of the complex specific permittivity $\in''$=1.13, a real part of the complex specific magnetic permeability $\mu'$=1.02 and an imaginary part of the specific magnetic permeability $\mu''$=0.48 and a thickness is set at 0.5 mm. Material constants at 2.4 GHz for instance of a dielectric layer 3 are set in such a manner that $\in'$=3.79 and $\in''$=0.03 and a thickness is set at 2.0 mm. That is, as an electromagnetic wave absorber of a 2.4-GHz band, a thin type having a thickness of 2.5 mm (0.5 mm as a thickness of a layer having the magnetic permeability) is realized. However, the material constants and the thickness, without restricting thereto, can select arbitrary combinations. For instance, in order to achieve more thinning, owing to a wavelength shortening effect by improving $\in'$ or $\mu'$, one having a total thickness of 0.5 mm or 1.0 mm can as well be produced.

Figure 6:
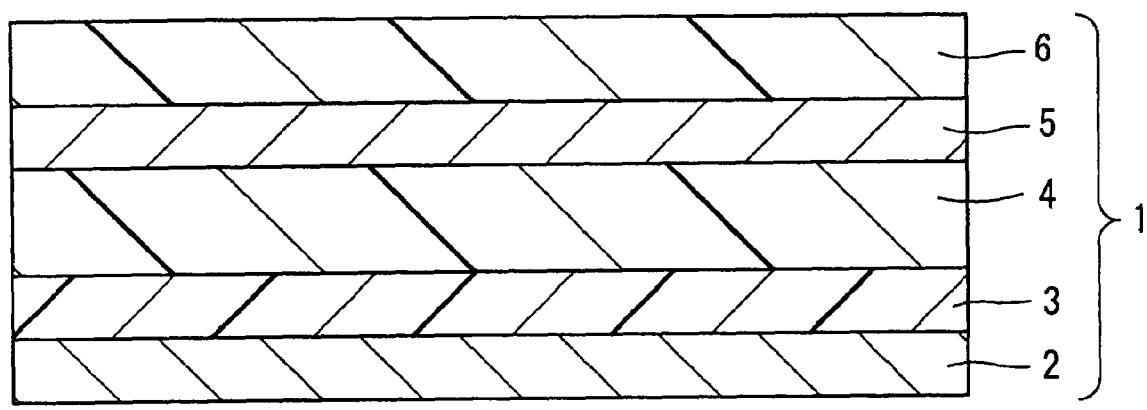
FIG. 6 is a sectional view of an electromagnetic wave absorber 1 of still another embodiment of the invention.

FIG. 6 is a sectional view of an electromagnetic wave absorber 1 according to still another embodiment of the invention. In the embodiment, portions similar and corresponding to embodiments of the FIGS. 2 through 4 are shown with the same reference numerals. In particular, in the embodiment, on the electromagnetic wave incidence side of the pattern layer 5 (in the above of FIG. 6), as mentioned above, a superficial layer 6 may be further disposed. The configuration is not restricted to ones shown in FIGS. 5 and 6. For instance, one in which, from the electromagnetic wave incidence side, an electromagnetic wave absorbing layer 4, a pattern layer 5, an electromagnetic wave absorbing layer 4, a dielectric layer 3, and a conductive reflective layer 2 are formed in this order can be realized.

Examples of the embodiments of the invention include a laminated body in which, from an incident direction of electromagnetic wave, a pattern layer 5, an electromagnetic wave absorbing layer 4, a dielectric layer 3 and a conductive reflective layer 2 are laminated in this order; a laminated body in which, from an incident direction of electromagnetic wave, an electromagnetic wave absorbing layer 4, a pattern layer 5, a dielectric layer 3 and a conductive reflective layer 2 are laminated in this order; a laminated body where an electromagnetic wave absorbing layer 4, a pattern layer 5, an electromagnetic wave absorbing layer 4, a dielectric layer 3 and a conductive reflective layer 2 are laminated in this order from an electromagnetic wave entrance direction; a laminated body in which a pattern layer 5, a dielectric layer 3 and a conductive reflective layer 2 are laminated in this order from an electromagnetic wave incidence direction; and the like. However, without restricting thereto, laminated bodies of various modes can be included. Furthermore, in the laminated bodies, only essential layers are extracted and the layers may not be necessarily arranged in the above orders. Even when, for instance, an adhesive layer, a support or a protective layer is inserted between the respective layers, an identical advantage can be obtained. Furthermore, when an adhesive is blended, an adhesive layer and a dielectric layer 3 or an electromagnetic wave absorbing layer 4 can be combined.

In still another embodiment of the invention, an electromagnetic wave absorber may be configured, without containing the conductive reflective layer 2 in the respective embodiments of FIGS. 2 through 6, so that such the electromagnetic wave absorber that does not contain the conductive reflective layer 2 may be disposed on a surface having the electromagnetic wave shielding properties on a side (downward in FIGS. 5 and 6) opposite to the electromagnetic wave incidence side (upward in FIGS. 5 and 6) of the dielectric layer 3. The surface having the electromagnetic wave shielding properties may have a configuration similar to, for instance, the conductive reflective layer 2 and may be realized with for instance a metal plate or the like. Such a configuration can achieve the electromagnetic wave absorption characteristics similar to the electromagnetic wave absorber having the conductive reflective layer 2.

Figure 7:
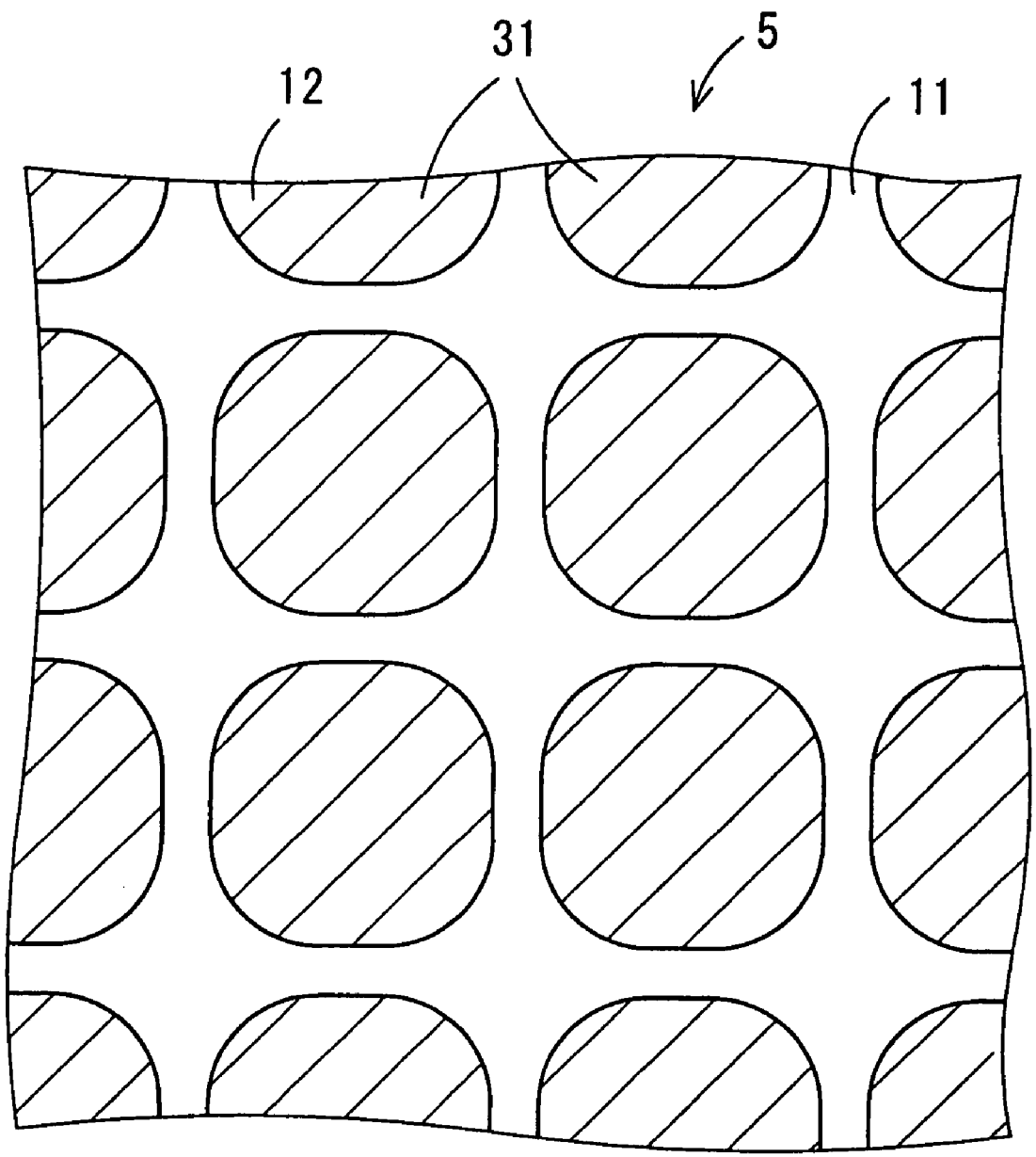
FIG. 7 is a front view showing a pattern layer 5 that constitutes an electromagnetic wave absorber 1 of further still another embodiment of the invention.

FIG. 7 is a front view showing a pattern layer 5 that constitutes an electromagnetic wave absorber 1 of another embodiment of the invention. In the embodiment, in place of the pattern layer 5 shown in FIGS. 3 and 4, a pattern layer 5 shown in FIG. 7 is used. Other configurations are same as the configurations of FIGS. 2 through 6. The conductive pattern 12 of the pattern layer 5 shown in FIGS. 3 and 4 has a radial pattern 30 and a substantially square pattern 31. However, a conductive pattern 12 of a pattern layer 5 of FIG. 7 has only a substantially square pattern 31. Even such a configuration can achieve a similar advantage.

Figure 8:
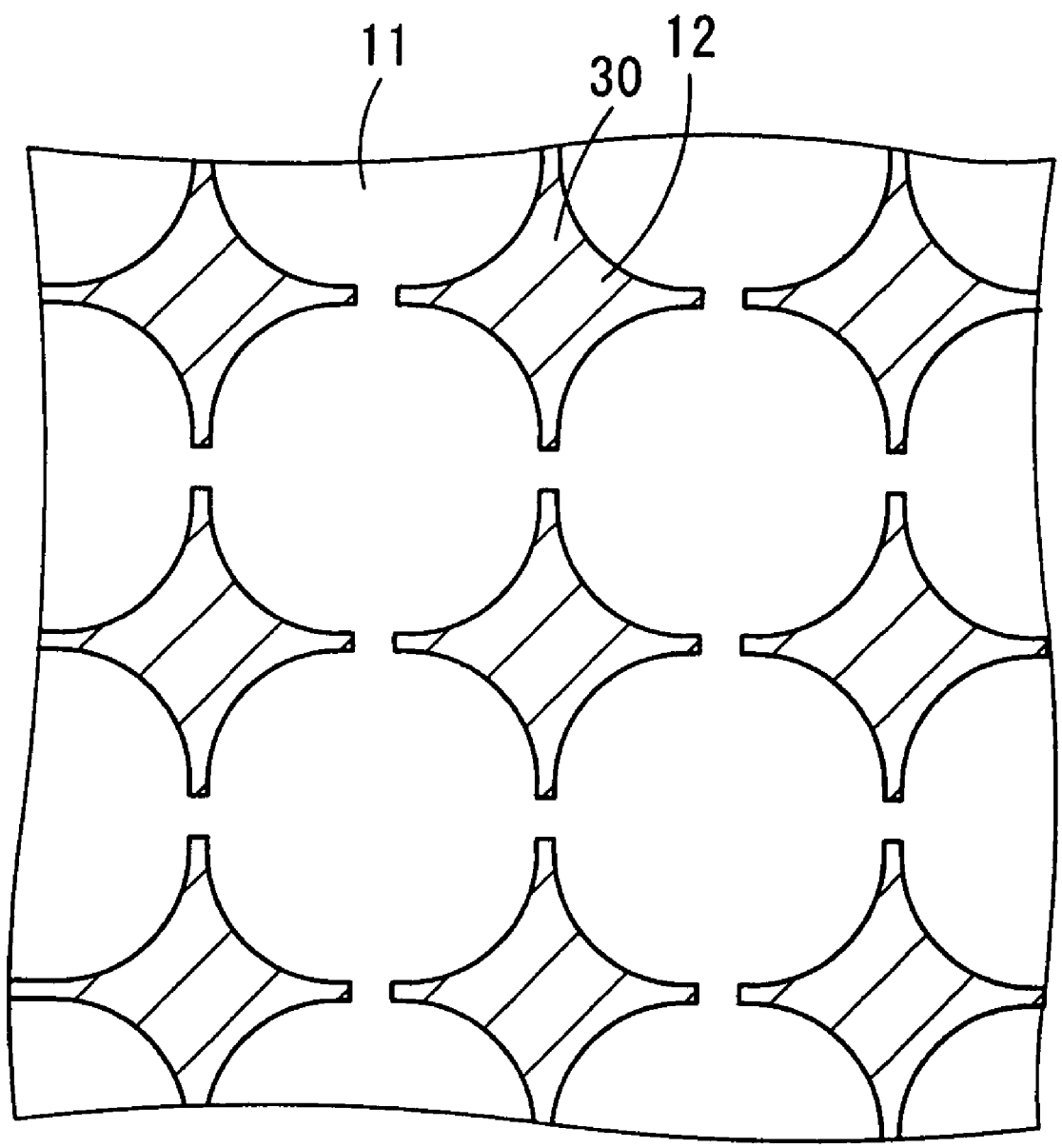
FIG. 8 is a front view showing a pattern layer 5 that constitutes an electromagnetic wave absorber 1 of another embodiment of the invention.

FIG. 8 is a front view showing a pattern layer 5 that constitutes an electromagnetic wave absorber 1 of still another embodiment of the invention. In the embodiment, in place of the pattern layer 5 shown in FIGS. 3 and 4, a pattern layer 5 shown in FIG. 8 is used. Other configurations are same as the configurations of FIGS. 2 through 6. The conductive pattern 12 of the pattern layer 5 shown in FIGS. 3 and 4 has a radial pattern 30 and a substantially square pattern 31. However, a conductive pattern 12 of a pattern layer 5 of FIG. 8 has only a radial pattern 30. Even such a configuration can achieve a similar advantage.

Figure 9:
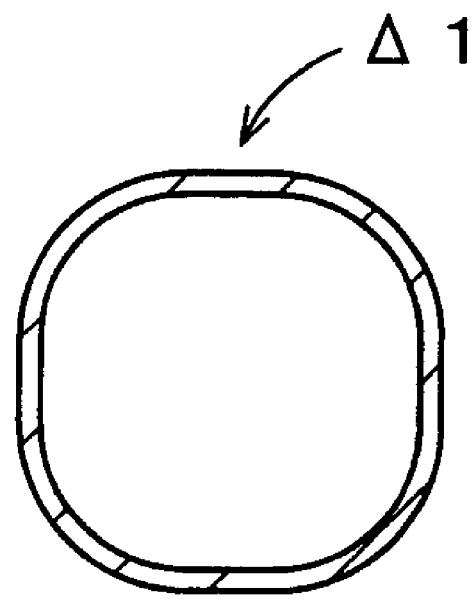
FIG. 9 is a front view showing a substantially square pattern 41 of still another embodiment of the invention.

FIG. 9 is a front view showing a substantially square pattern 41 of further still another embodiment of the invention. In the embodiment, in place of the substantially square patterns 31 in FIGS. 3, 4 and 7, a substantially square pattern 41 shown in FIG. 9 is used. Other configurations are same as the configurations of FIGS. 2 through 7. The substantially square patterns 31 shown in FIGS. 3, 4 and 7 are planar patterns. However, the substantially square pattern 41 of FIG. 9 is a line-shaped (band-shaped) pattern of a closed loop extending along an external peripheral border. Even such a configuration, although a capacitance of a capacitor formed between with the conductive reflective layer 2 becomes smaller, can achieve a similar advantage.

Figure 10:
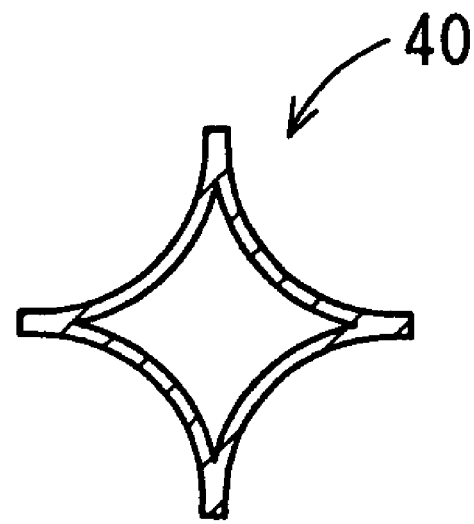
FIG. 10 is a front view showing a radial pattern 40 of further still another embodiment of the invention.

FIG. 10 is a front view showing a radial pattern 40 of another embodiment of the invention. In the embodiment, in place of the radial patterns 30 in FIGS. 3, 4 and 8, a radial pattern 40 shown in FIG. 10 is used. Other configurations are same as the configurations of FIGS. 2 through 6 and 8. The radial patterns 30 shown in FIGS. 3, 4 and 8 are planar patterns. However, the substantially radial pattern 40 of FIG. 10 is a line-shaped (band-shaped) pattern of a closed loop extending along an external peripheral border. Even such a configuration, although a capacitance of a capacitor formed between with the conductive reflective layer 2 becomes smaller, can achieve a similar advantage.

Figure 11:
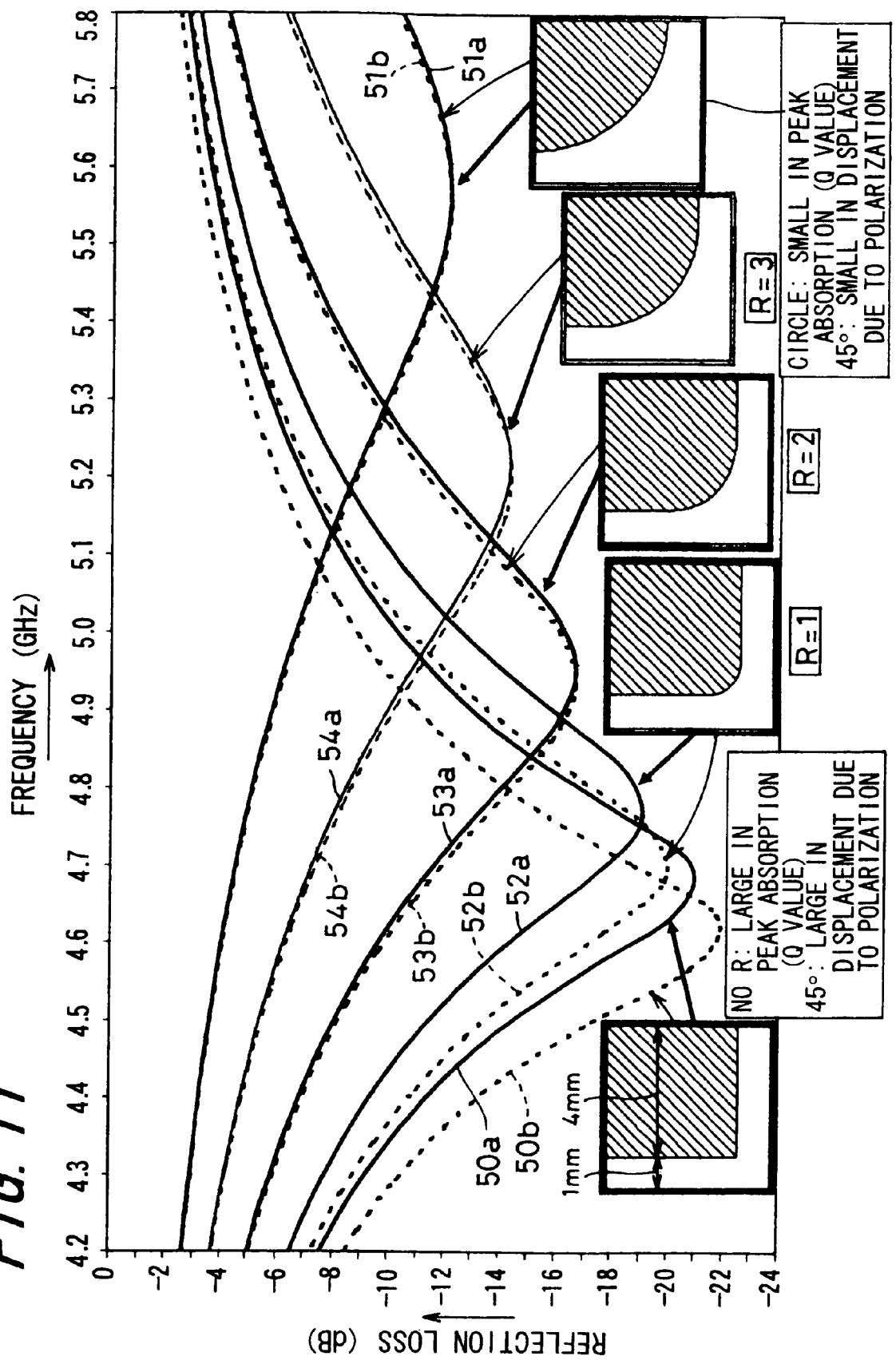
FIG. 11 is a graph showing simulation results of the absorption characteristics of an electromagnetic wave.

FIG. 11 is a graph showing results of simulation of the absorption characteristics of electromagnetic waves. As a configuration of an electromagnetic wave absorber 1, a configuration of FIG. 2 is taken. In FIG. 11, a horizontal axis shows a frequency and a vertical axis shows the reflection loss. The smaller a value of the reflection loss is, the larger the absorption amount of electromagnetic wave is. Of electromagnetic wave absorbers in which squares, substantial squares of which corner portions are formed in arc and circular patterns are arranged as shown in FIG. 7, the reflection characteristics are obtained. Except conditions of the curvature radii at corner portions, all conditions are same.

Irrespective of subscripts "a" and "b", lines 50a and 50b with a mark 50 show the electromagnetic wave absorption characteristics of a square pattern. Irrespective of subscripts "a" and "b", lines 51a and 51b with a mark of 51 show the electromagnetic wave absorption characteristics of a circular pattern. Irrespective of subscripts "a" and "b", lines 52a and 52b with a mark of 52 show the electromagnetic wave absorption characteristics of a pattern in which with a square as a basis corner portions are formed in arc with a small curvature radius. Irrespective of subscripts "a" and "b", lines 53a and 53b with a mark of 53 show the electromagnetic wave absorption characteristics of a pattern in which with a square as a basis corner portions are formed in arc with an intermediate curvature radius. Irrespective of subscripts "a" and "b", lines 54a and 54b with a mark of 54 show the electromagnetic wave absorption characteristics of a pattern in which with a square as a basis corner portions are formed in arc with a small curvature radius. Of the respective patterns, the electromagnetic wave absorption characteristics to electromagnetic waves different by 45° in the polarization direction are shown differentiated with subscripts "a" and "b".

In the square pattern (0 R), the Q value is high and, although a peak value (peak absorption amount) of an absorption amount of electromagnetic wave is large, a frequency band where the absorption amount is large is narrow; accordingly, it is troublesome to match a frequency to an intended frequency to absorb. Furthermore, depending on the polarization direction of the electromagnetic wave, a frequency (peak frequency) where an absorption amount of electromagnetic wave becomes a peak is largely displaced; that is, the polarization characteristics are poor. In the circular pattern, the polarization characteristics are very excellent; however, since the Q value is small and a peak absorption amount is small. On the other hand, in the pattern (square with R) where with a square as a basis corner portions are formed in curve, a peak absorption amount is large and the polarization characteristics are excellent.

As obvious from FIG. 11, in the pattern where with a square as a basis corner portions are formed in curve, in a dimension of a portion that is formed in curve at a corner portion, a range that can suppress displacement of frequency of electromagnetic wave which can be absorbed due to the difference of the polarization direction, that is, a range where the polarization characteristics substantially same as the circular pattern can be obtained exists. In case of FIG. 11, of three curvature radii at corner portions, in patterns of two radii on a larger side, excellent polarization characteristics are obtained. Since the peak absorption amount becomes larger as the curvature radius at the corner portion becomes smaller, it is preferred that, within a range where the polarization characteristics similar to that of the circle can be obtained, the corner portion is formed in curve with a curvature radius with a dimension as small as possible. In the case of FIG. 11, a side length of a square 25 to which the substantially square patter 31 corresponds is 8 mm. When a sample in a position that has a side in parallel with the polarization direction is in a position of 0° (solid lines in the drawing, and, hereinafter, in some cases, referred to as "0°° polarization"), the reflection loss when R=2 is −17 dB and the reflection loss when R=3 is −14 dB. Even when the sample is displaced through 45° from a position of the 0° (chained line in the drawing, and, hereinafter, in some cases, referred to as "45° polarization"), it is found that the absorption frequency is hardly displaced, that is, the polarization characteristics are excellent.

The reflection loss is the loss when a viewpoint in that an electromagnetic wave entered in an electromagnetic wave absorber is reflected by the electromagnetic wave absorber is taken, expresses the loss when the electromagnetic wave is absorbed by the electromagnetic wave absorber and a value corresponding to an absorption amount of the electromagnetic wave in the electromagnetic wave absorber. The reflection loss is expressed with a minus value and an absolute value of the reflection loss becomes an absorption amount of the electromagnetic wave.

Figure 12:
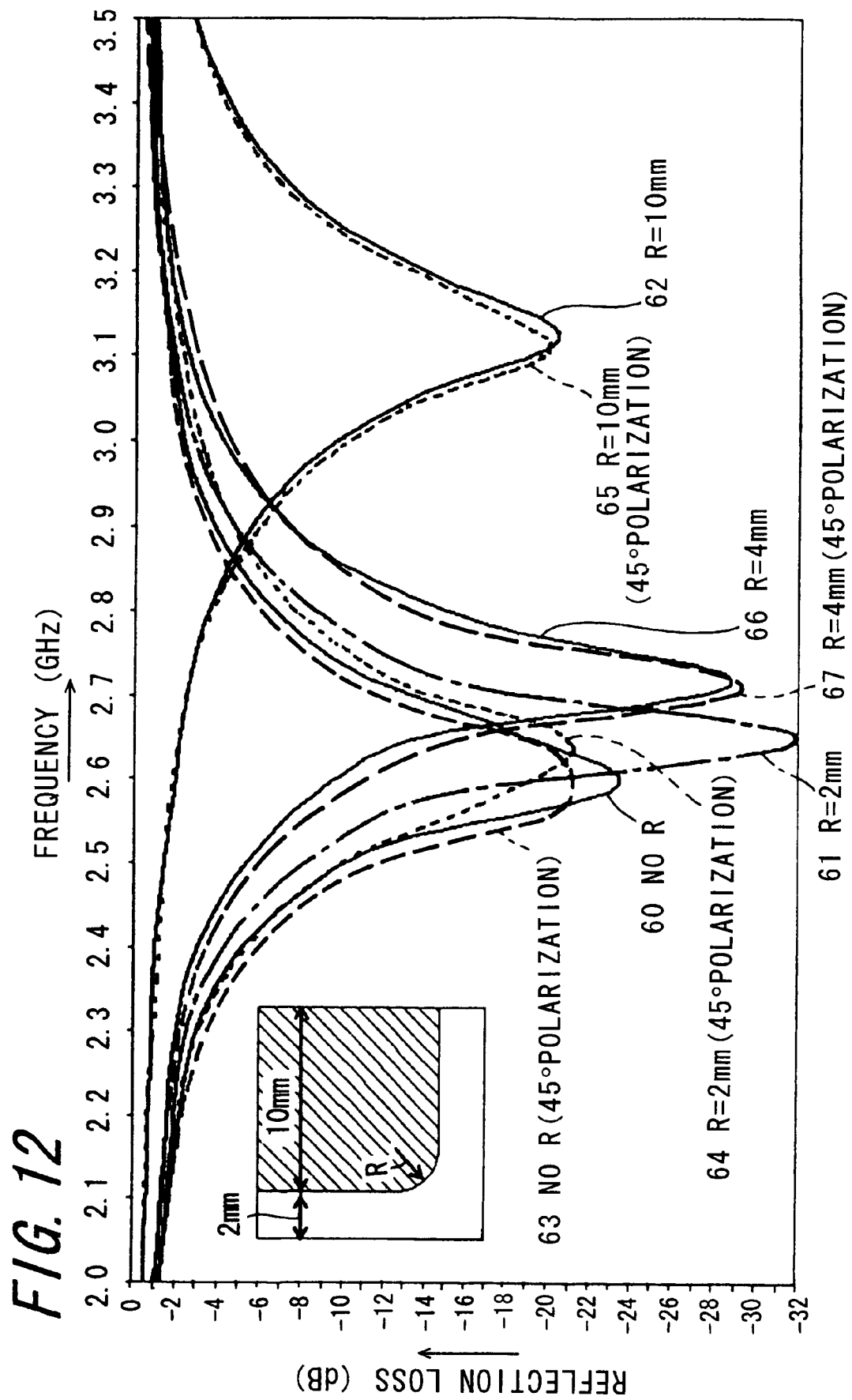
FIG. 12 is a graph (simulation results) showing results of improvements in the absorption characteristics due to R impartation and shifting of the absorption frequency to a high frequency.

FIG. 12 is a graph showing how the electromagnetic wave absorption characteristics vary with a dimension of a portion that is formed in curve at a corner portion in a conductive pattern in which with a square as a basis corner portions are formed in curve. FIG. 12 shows examples where when the corner portions of the conductive pattern are formed in curve, the Q values are increased, the reflection losses become larger, and the electromagnetic wave absorption characteristics are improved. In examples of FIG. 12, a length of one side of the conductive pattern is set at 20 mm.

In the case of the curvature radius R=0 mm, the reflection loss of electromagnetic wave having 0° polarization is shown with a line 60, and a peak value is −23 dB (2.6 GHz). In the case of the curvature radius R=2 mm, the reflection loss of electromagnetic wave having 0° polarization is shown with a line 61, and a peak value becomes −32 dB (2.65 GHz). Thus, it is considered that, owing to impartation of R (formation of curved portion), a flow of the resonant current becomes smoother to increase the Q value. This shows that the square pattern is not always in a state highest in the Q value. When the curvature radius R is further increased, this time, a value of the reflection loss becomes smaller and tendency of shifting toward a higher frequency is shown. In the case of the curvature radius R=10 mm, the reflection loss of electromagnetic wave having 0° polarization is shown with a line 63, and a peak value is lower than that when the curvature radius R=0 mm. Accordingly, in order to improve the reflection loss, it can be said that the curvature radius R is excellent to be in the range of 1 mm<R<20 mm.

In the case of the curvature radius R=0 mm, the reflection loss of electromagnetic wave having 45° polarization is shown with a line 63, in the case of the curvature radius R=2 mm, the reflection loss of electromagnetic wave having 45° polarization is shown with a line 64, and in the case of the curvature radius R=10 mm, the reflection loss of electromagnetic wave having 45° polarization is shown with a line 65. In the case of the curvature radius R=4 mm, the reflection loss of electromagnetic wave having 0° polarization is shown with a line 66, and, in the case of the curvature radius R=4 mm, the reflection loss of electromagnetic wave having 45° polarization is shown with a line 67. A reflection loss improvement effect including the polarization characteristics is most excellent at the curvature radius R=4 mm (reflection loss: −29 dB). From the results, it is found that there is a case where, when a pattern shape is provided with R, the absorbing frequency can be inhibited from shifting toward a higher frequency and the Q value as well can be optimized; accordingly, the impartation of R is effective means for controlling the electromagnetic wave absorption characteristics. Furthermore, when the displacement of the absorption characteristics in a case of an angular movement of 45° (at the 45° polarization) is calculated, the improvement effect of the impartation of R can be assuredly confirmed.

In the embodiment, a dimension of a portion that is formed in curve at the corner portion is determined at a small dimension within the range of a dimension that can suppress the displacement of frequency of electromagnetic wave which can be absorbed due to the difference of the polarization direction. Owing to such a configuration, a portion that is formed in curve at the corner portion can be made as small as possible. Thereby, as obvious from FIGS. 11 and 12, while suppressing a frequency where an absorption amount becomes a peak depending on the polarization direction of the electromagnetic wave from displacing, a peak value of the absorption amount of the electromagnetic wave can be made as high as possible. That is, when the curvature radius R of a curve at the corner portion becomes larger, the pattern shape approaches a circle to be finally a circle. As the result, the Q value decreases and the electromagnetic wave absorption characteristics tend to deteriorate; however, the polarization characteristics are improved. Accordingly, when a dimension of a portion that is formed in curve at the corner portion is determined at a small dimension within the range of a dimension that can suppress displacement of frequency of electromagnetic wave which can be absorbed due to the difference of the polarization direction, a pattern shape where a magnitude of the curvature radius R is optimized so as to heighten the electromagnetic wave absorption characteristics but improve the polarization characteristics is formed. Accordingly, an electromagnetic wave absorber having very excellent electromagnetic wave absorption characteristics can be realized.

Figure 13:
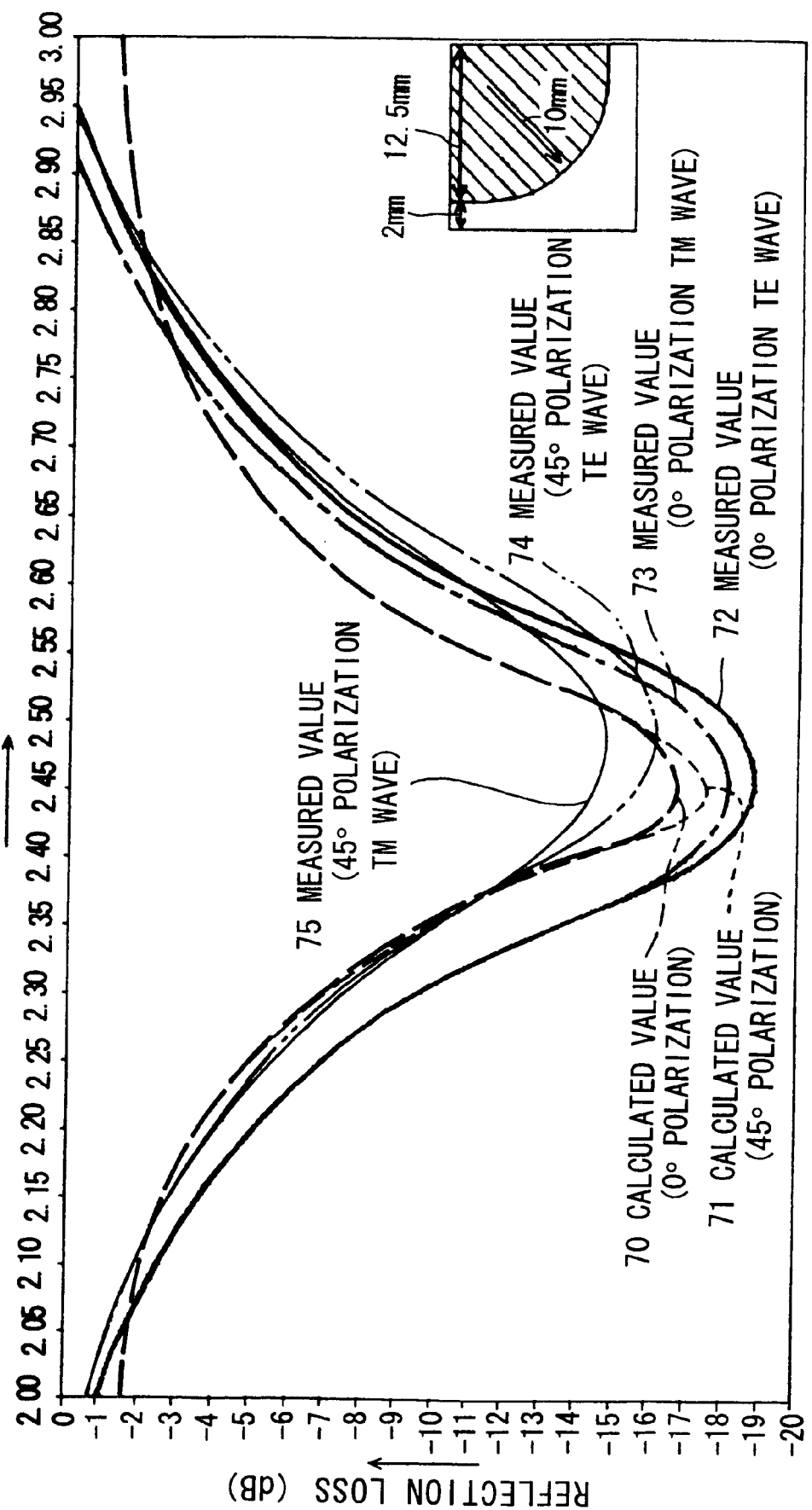
FIG. 13 is a graph comparing simulation results and actual measurements of the absorption characteristics of a 2.45-GHz band.

FIG. 13 is a graph showing comparing calculated values and measurements of the electromagnetic wave absorption characteristics of an electromagnetic wave absorber 1 according to a pattern arrangement of FIG. 7 that uses a substantially square pattern 31 with R. A curve 70 shows calculated values of the electromagnetic wave absorption characteristics of an electromagnetic wave having 0° polarization and a curve 71 shows calculated values of the electromagnetic wave absorption characteristics of an electromagnetic wave having 45° polarization. A curve 72 shows measured values of the electromagnetic wave absorption characteristics of an electromagnetic wave of 0° polarized TE wave and a curve 73 shows measured values of the electromagnetic wave absorption characteristics of an electromagnetic wave of 0° polarized TM wave. A curve 74 shows measured values of the electromagnetic wave absorption characteristics of an electromagnetic wave of 45° polarization TE wave and a curve 75 shows measured values of the electromagnetic wave absorption characteristics of an electromagnetic wave of 45° polarization TM wave.

The electromagnetic wave absorber 1 that uses the substantially square pattern 31 is designed so as to match an electromagnetic wave absorption peak to 2.45 GHz. According to calculation, the reflection loss of substantially −17 dB is obtained and the displacement of the absorption characteristics at 45° polarization is hardly found. The measured values are the electromagnetic wave absorption characteristics due to a free-space method at 0° polarization and 45° polarization to the TE wave and TM wave. The measured values of the reflection losses (corresponding to electromagnetic wave absorption amount) are in the range of −15 to −19 dB (including TE wave and TM wave and 0° and 45° polarizations) and small in the difference from the calculated values and measured values have a little larger bandwidth. Owing to impartation of R, the absorption characteristics excellent in the polarization characteristics are observed.

Figure 14:
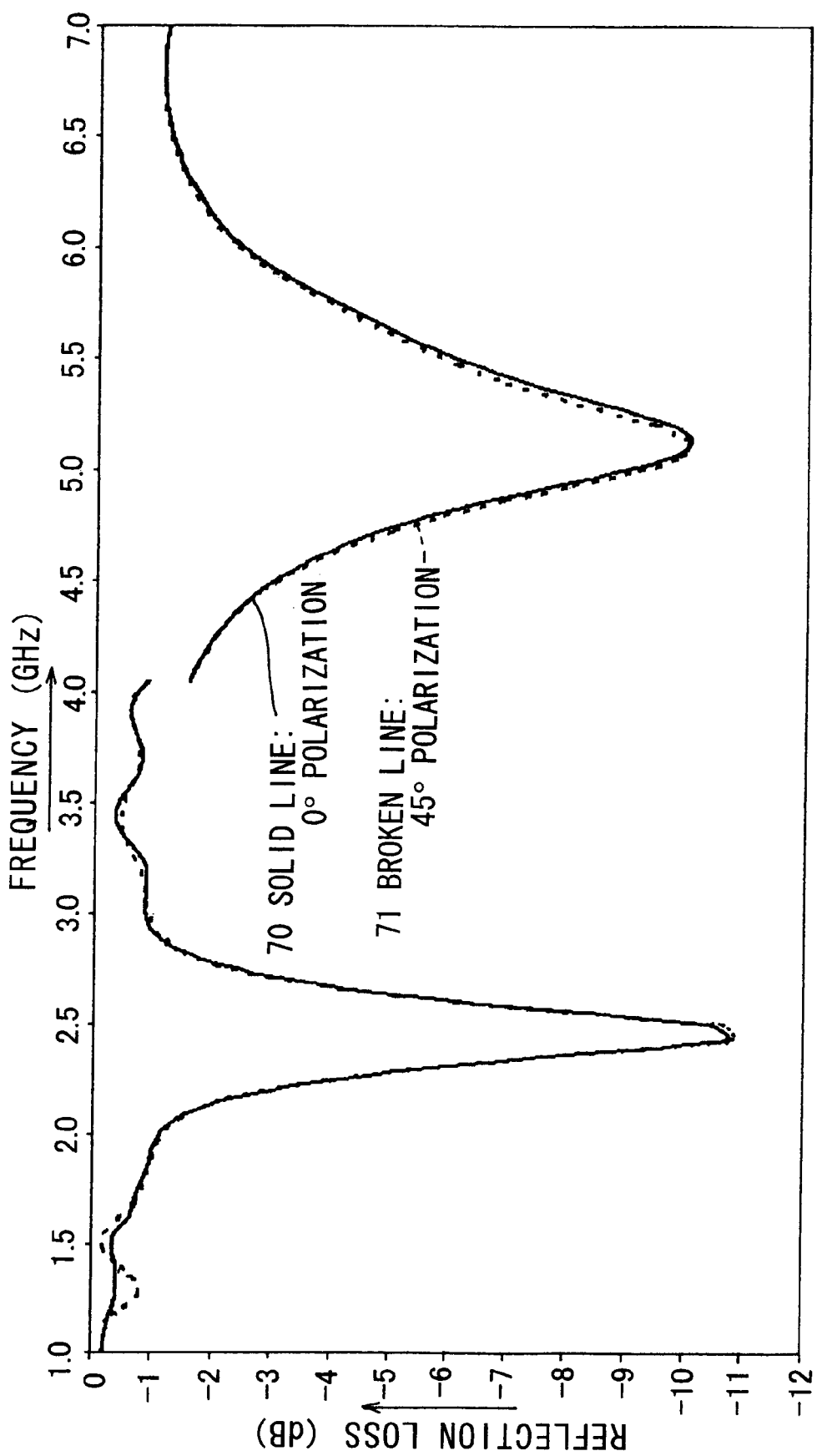
FIG. 14 is a graph showing simulation results having two absorption frequencies.
Figure 15:
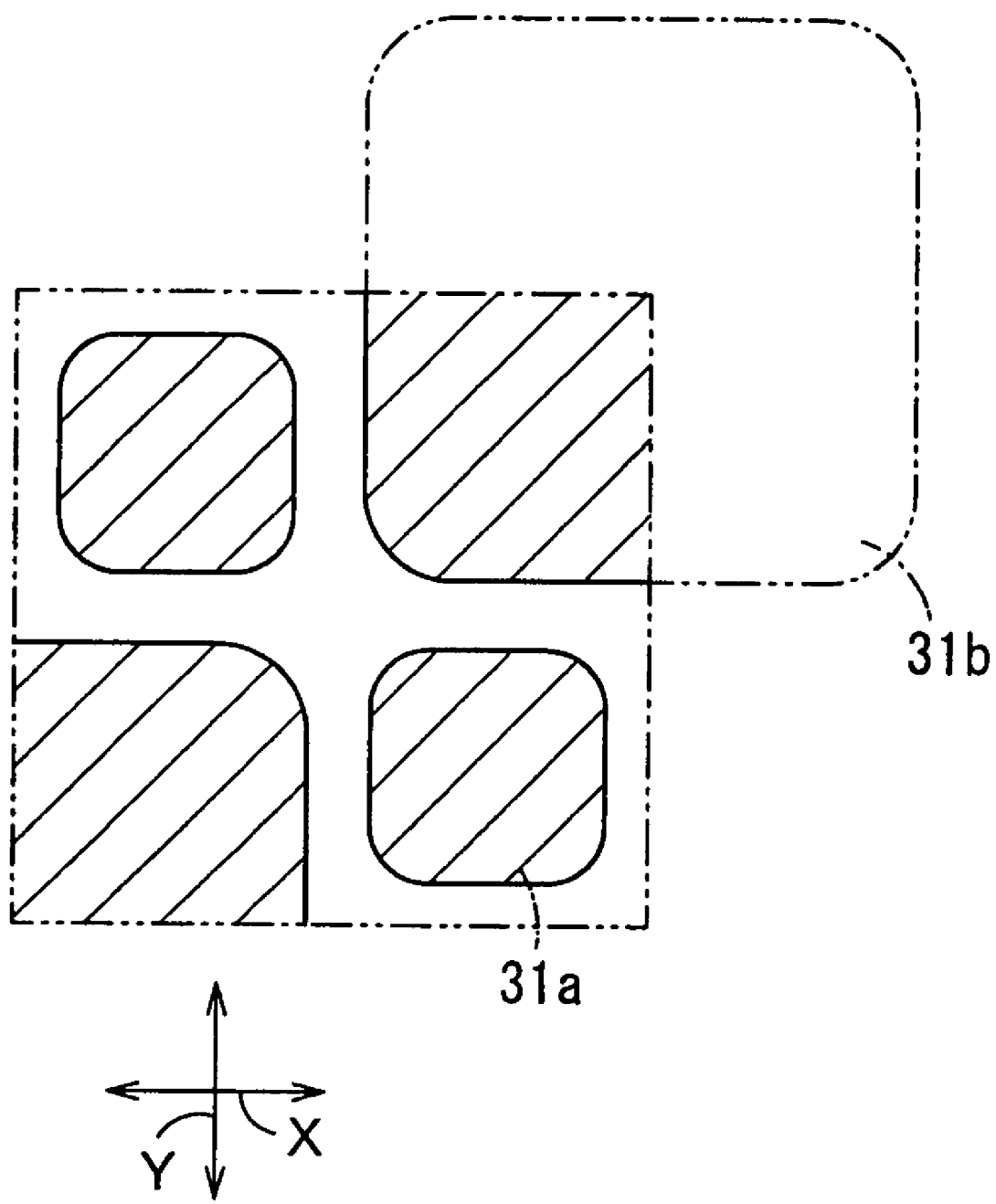
FIG. 15 is a front view partially showing a conductive pattern showing the electromagnetic wave absorption characteristics of FIG. 14, specifically, an arrangement of a substantially square pattern 31.

FIG. 14 is a graph showing the electromagnetic wave absorption characteristics of an electromagnetic wave absorber 1 in which substantially square patterns 31 with R and different in size are arranged to intend to absorb the electromagnetic waves of two frequencies. FIG. 15 is a front view partially showing a conductive pattern showing the electromagnetic wave absorption characteristics of FIG. 14, specifically, an arrangement of substantially square pattern 31. As another embodiment of the invention, conductive patterns different in outer peripheral length are combined to form. In the embodiment, as the substantially square pattern 31, a first substantially square pattern 31a having a side length of a corresponding square 25 of 10 mm and a second substantially square pattern 31b having a side length of a corresponding square 25 of 24 mm are used, and a square pattern unit shown in FIG. 15 and having a side length of 27 mm is disposed repeatedly so as to place a mirror surface in an x direction and in a y direction to form a pattern layer 5. In other words, the first substantially square patterns 31b are disposed in a checkered pattern, and, between the first substantially square patterns 31b, the second substantially square patterns 31a are disposed by four in matrix.

In FIG. 14, a solid line 70 shows the electromagnetic wave absorption characteristics of 0° polarization and a broken line 71 shows the electromagnetic wave absorption characteristics of 45° polarization. In the electromagnetic wave absorber 1, the reflection loss (electromagnetic wave absorption characteristics) shows two absorption peaks of substantially −10 dB for both at 2.45 GHz and 5.2 GHz. Furthermore, when the absorption characteristics at 45° polarization are calculated, the displacement is hardly found. That is, an improvement effect of the R impartation can be assuredly confirmed.

Table 1 shows comparing the electromagnetic wave absorption characteristics when substantially square patterns 31 having different curvature radii R are combined.

TABLE 1

| Configuration | Magnitude of R (mm) | | Width of Absorption Band (MHz) | | | |
|---|---|---|---|---|---|---|
| | Large | Small | −20 dB | −15 dB | −10 dB | −6 dB |
| One Kind | 7 | 7 | 16.8 | 33.6 | 67.1 | 134.2 |
| Two Kinds 1 | 8 | 6 | 33.6 | 50.3 | 83.9 | 167.8 |
| Two Kinds 2 | 9 | 5 | 16.8 | 33.6 | 67.1 | 151.0 |
| Two Kinds 3 | 10 | 4 | 0.0 | 16.8 | 50.4 | 117.5 |

Figure 16:
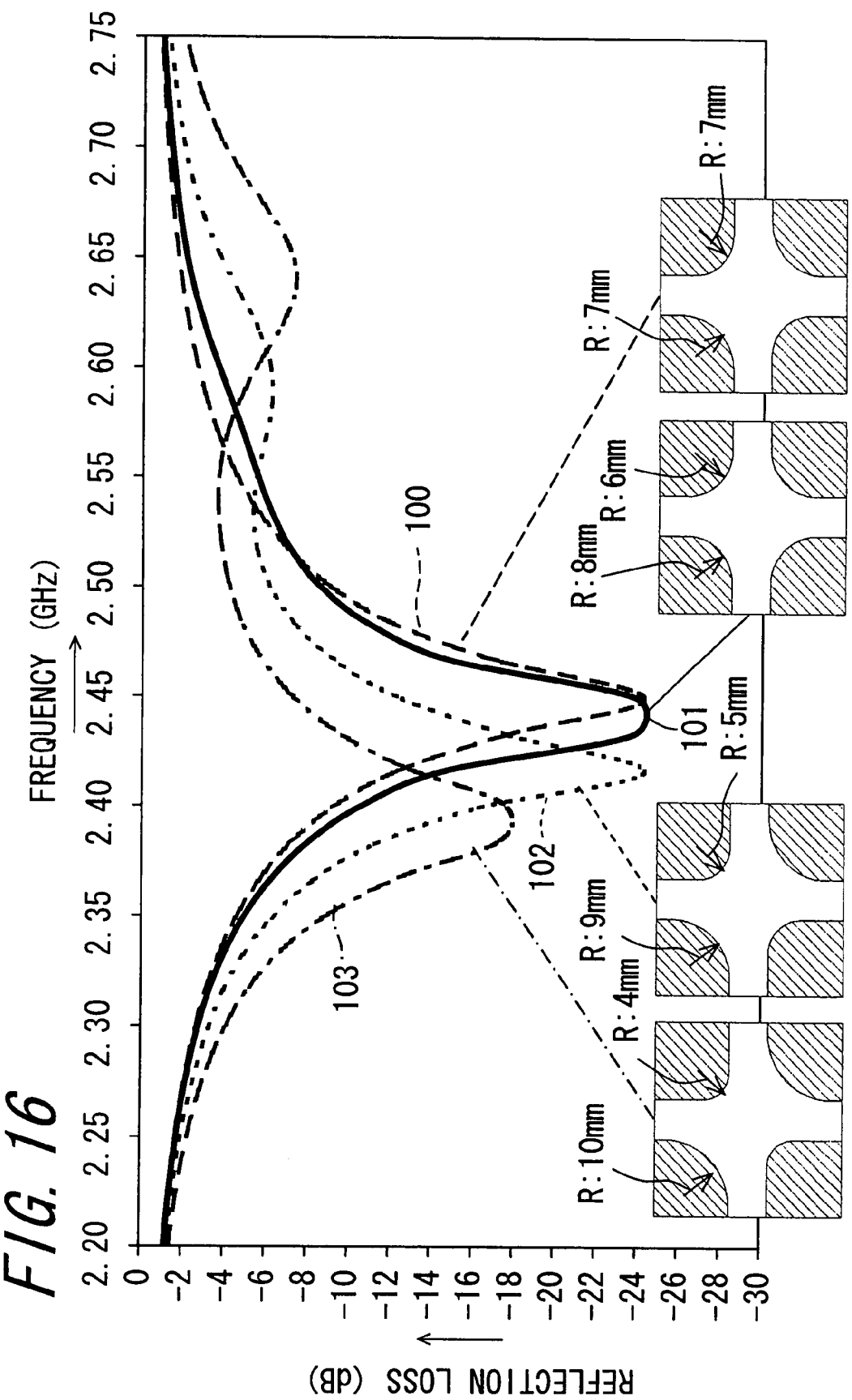
FIG. 16 is a graph showing simulation results that show how the electromagnetic wave absorption characteristics vary when substantially square patterns 31 different in curvature radius R are combined.

FIG. 16 is a graph showing comparing the electromagnetic wave absorption characteristics when substantially square patterns 31 having different curvature radii R are combined. As another embodiment of the invention, conductive patterns having different curvature radii at the corner portion are combined to form. In the embodiment, in a configuration where substantially square patterns 31 shown in FIG. 7 are arranged, between substantially square patterns 31 adjacent in an x direction and a y direction, the curvature radii R are different, and substantially square patterns 31 where the curvature radii R of the respective corner portions have a first value and substantially square patterns 31 where the curvature radii R of the respective corner portions have a second value are arranged in a checkered pattern. The first value and the second value are different. The curvature radius R, though corresponding to the curvature radius R1 at the corner portion of the substantially square pattern 31 in FIGS. 3 and 4 that are used in the explanation of FIG. 7, is expressed with "R" for the sake of convenience.

FIG. 16 shows how the electromagnetic wave absorption characteristics become different when, in a configuration where substantially square patterns 31 are arranged as shown in FIG. 7, the curvature radii of the substantially square patterns 31 adjacent in an x direction and a y direction are varied. In FIG. 16, the respective lines 100 through 103 show the electromagnetic wave absorption characteristics of configurations where the respective corner portions of squares having a side length of 23 mm are formed in curve. A separation between squares is 6 mm. A broken line 100 shows the electromagnetic wave absorption characteristics when the curvature radii R of the substantially square patterns 31 adjacent in an x direction and a y direction are the same and 7 mm. A solid line 101 shows the electromagnetic wave absorption characteristics when among the substantially square patterns 31 adjacent in an x direction and a y direction, the curvature radii R of the respective corner portions of one substantially square patterns 31 are 6 mm and the curvature radii R of the respective corner portions of the other substantially square patterns 31 are 8 mm. A dotted line 102 shows the electromagnetic wave absorption characteristics when among the substantially square patterns 31 adjacent in an x direction and a y direction, the curvature radii R of the respective corner portions of one substantially square patterns 31 are 5 mm and the curvature radii R of the respective corner portions of the other substantially square patterns 31 are 9 mm. A chain line 103 shows the electromagnetic wave absorption characteristics when among the substantially square patterns 31 adjacent in an x direction and a y direction, the curvature radii R of the respective corner portions of one substantially square patterns 31 are 4 mm and the curvature radii R of the respective corner portions of the other substantially square patterns 31 are 10 mm.

The broken line 100 shows the electromagnetic wave absorption characteristics of a configuration expressed by "one kind" in Table 1. The solid line 101 shows the electromagnetic wave absorption characteristics of a configuration expressed by "two kinds 1" in Table 1. The dotted line 102 shows the electromagnetic wave absorption characteristics of a configuration expressed by "two kinds 2" in Table 1. The chain line 103 shows the electromagnetic wave absorption characteristics of a configuration expressed by "two kinds 3" in Table 1. In Table 1, widths of the absorption bands, respectively, show widths of frequency bands where the reflection loss is −20 dB, −15 dB, −10 dB and −6 dB.

When the curvature radii R of the corner portions of adjacent substantially square patterns 31 are differed, external periphery lengths of the substantially square patterns 31 are differentiated and the resonant frequencies become different accordingly. The difference of the electromagnetic wave absorption characteristics when the curvature radii R of the corner portions of adjacent substantially square patterns 31 are same and different is not such a simple difference as that, for instance, when the curvature radii R is made larger, proportional to the ratio, an external periphery length of the substantially square pattern 31 becomes shorter and thereby the resonant frequency shifts toward a higher frequency. As obvious from FIG. 16, when difference between the curvature radii R of two adjacent substantially square patterns 31 is made larger with a sum total thereof maintained constant, an absorption frequency of the electromagnetic wave shifts toward a lower frequency. The absorption frequency is a frequency where the absorption amount becomes a peak value.

Moreover, when the difference of the curvature radii R of two adjacent substantially square patterns 31 is small, that is, in the case where the difference is 2 mm in an example shown in FIG. 16, with the peak value of the absorption amount of the electromagnetic wave maintained at the peak value of the absorption amount at the peak value when the curvature radii R of two adjacent substantially square patterns 31 are same, an absorption band is expanded. It is confirmed by the inventors that a phenomenon where the absorption band is expanded is caused when a separation between adjacent conductive patterns is relatively small, in other words, when the conductive patterns are present within a range where an interference effect is caused between the conductive patterns. When the difference of the curvature radii R between two adjacent substantially square patterns 31 is made further larger, the peak value of the electromagnetic wave absorption amount is not so much lowered and the absorption frequency is shifted toward a lower frequency. In an example shown in FIG. 16, in particular, when the difference of the curvature radii R is 4 mm or less, the peak value of the electromagnetic wave absorption amount maintains the peak value of the absorption amount when the curvature radii R of two adjacent substantially square patterns 31 are same.

Thus, it is obvious that the curvature radii R of two adjacent substantially square patterns 31 effectively contribute as a design parameter of an electromagnetic wave absorber. Owing to the interference and influence between adjacent conductive patterns, a peculiar phenomenon is caused. When a plurality of conductive patterns of which resonant frequencies caused by the difference of the curvature radii R at corner portions are near is combined, the absorption band and the resonant frequency can be varied. When the curvature radii R at corner portions of adjacent conductive patterns are differed, owing to an effect that the adjacent conductive patterns affect on each other, in comparison with a case where the curvature radii R at corner portions of the adjacent conductive patterns are made same, with the peak value of the absorption amount maintained, an absorption frequency can be altered.

Thus, according to a configuration where the curvature radii R at corner portions of adjacent conductive patterns are differed, in comparison with a case where only conductive patterns having same curvature radii at corner portions are used to configure, without lowering the peak value of the electromagnetic wave absorption amount, an absorption band can be varied. For instance, when a little difference is given to the curvature radii at corner portions of adjacent conductive patterns, without lowering the peak value of the absorption amount of the electromagnetic wave absorber, an absorption band can be expanded. Furthermore, when a little larger difference is given to the curvature radii at corner portions of adjacent conductive patterns, without lowering the peak value of the absorption amount of the electromagnetic wave absorber, a frequency (hereinafter, in some cases, referred to as absorption frequency) of the electromagnetic wave to be absorbed can be lowered.

Figure 17:
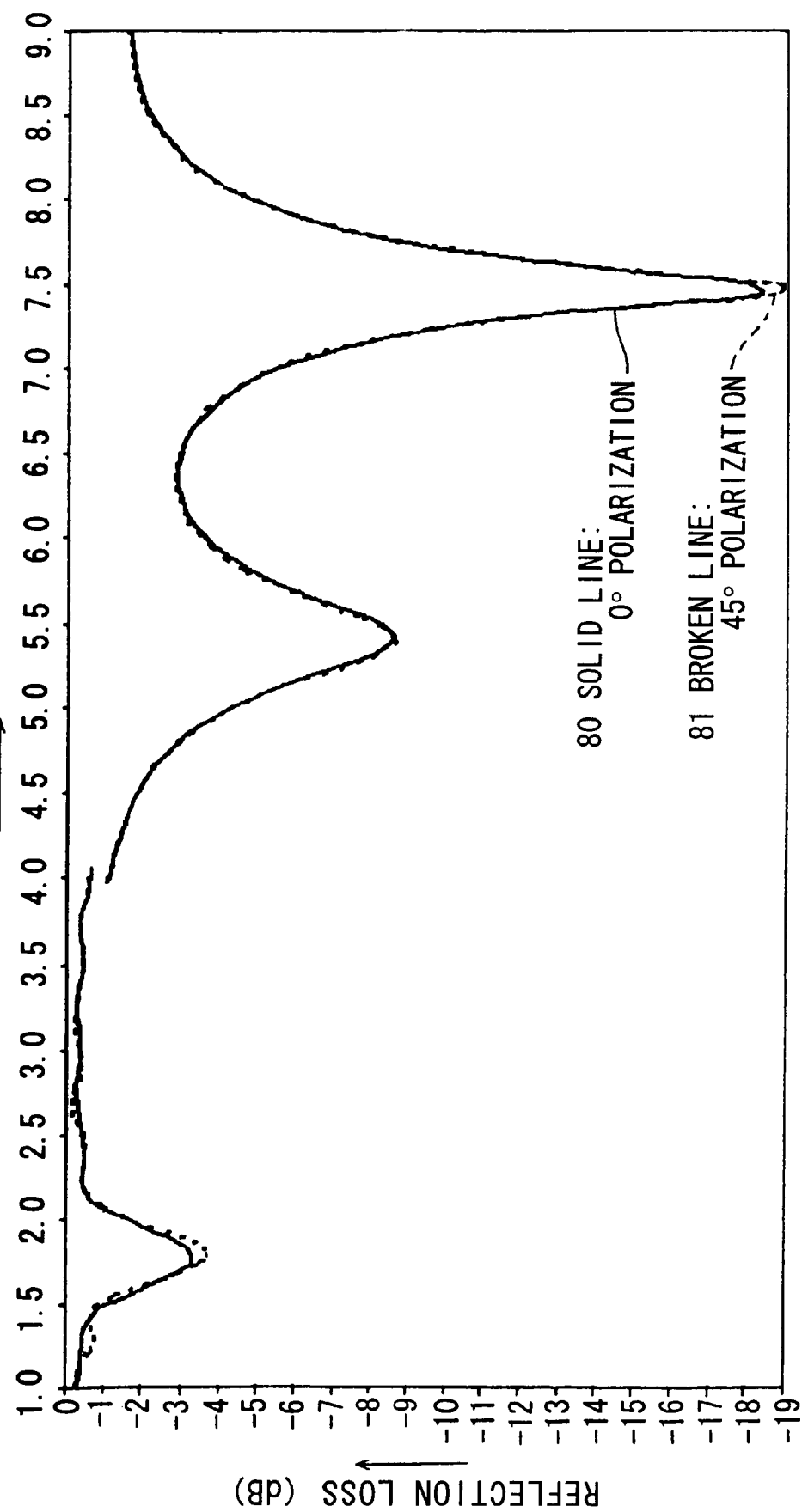
FIG. 17 is a graph showing simulation results having three absorption frequencies.
Figure 18:
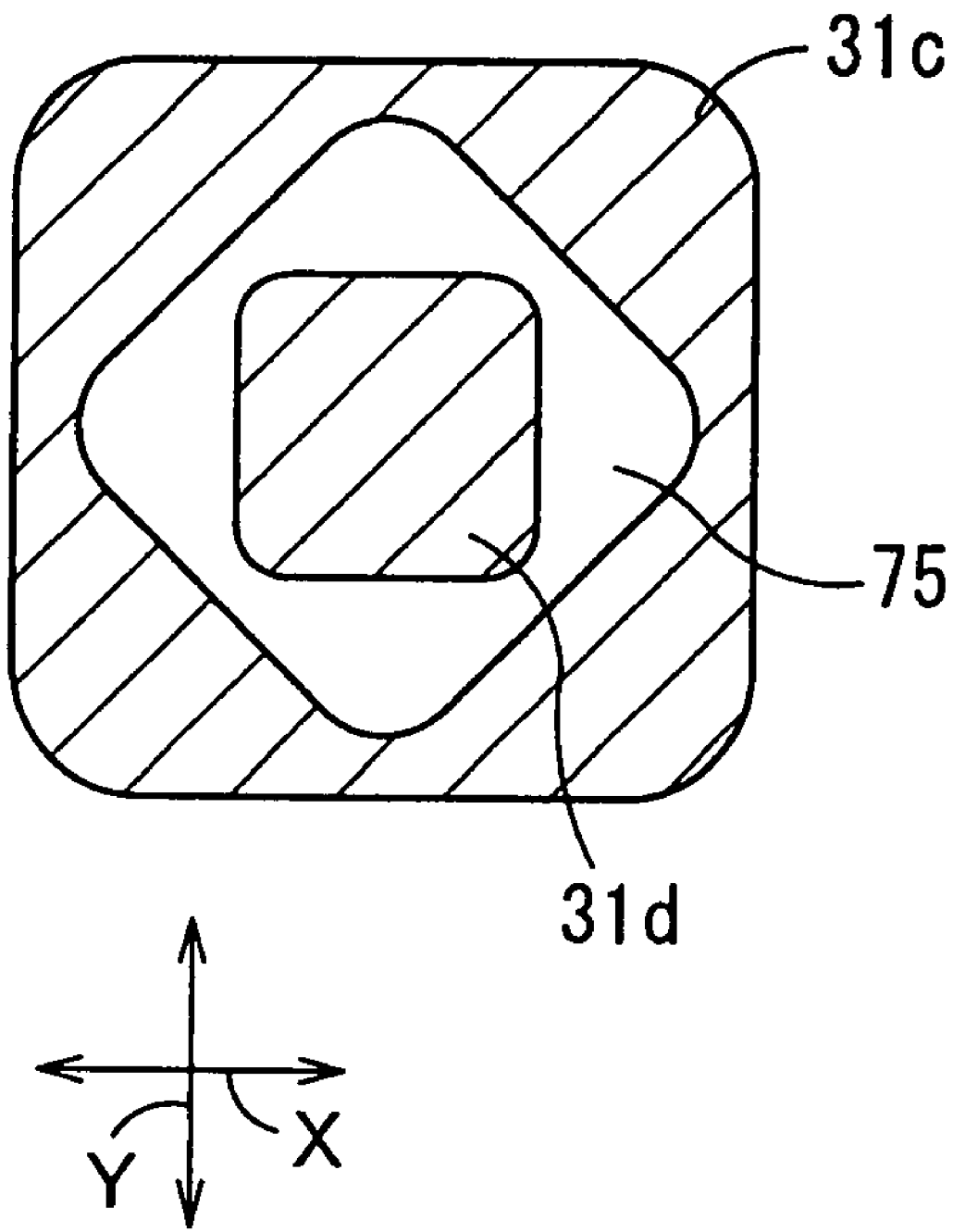
FIG. 18 is a front view partially showing a conductive pattern showing the electromagnetic wave absorption characteristics of FIG. 17, specifically, an arrangement of a substantially square pattern 31.

FIG. 17 is a graph showing the electromagnetic wave absorption characteristics of an electromagnetic wave absorber 1 having a pattern layer 5 in which in a substantially square pattern 31 with R a void portion (slot antenna portion) 75 is disposed and in the void portion 75 a further smaller substantially square pattern 31 is disposed. FIG. 18 is a front view partially showing an arrangement of a conductive pattern showing the electromagnetic wave absorption characteristics of FIG. 17. In the example, as the substantially square pattern 31, a first substantially square pattern 31c wherein a substantially square (four corner portions are formed in curve) void portion 75 that has a side length of a corresponding square 25 of 24 mm and is in a direction tilted by 45° to an outline is formed and a second substantially square pattern 31d that is disposed in a direction same as the first substantially square pattern 31c and formed inside of the void portion 75 are disposed. A side length of the void portion 75 is 16 mm and a side length of the second substantially square pattern 31d is 10 mm.

In FIG. 17, calculation results of the reflection losses of an electromagnetic wave absorber 1 that uses a pattern layer 5 in which a plurality of pattern units shown in FIG. 18 is arranged repeating in an x direction and a y direction are shown. In FIG. 17, a solid line 80 shows the electromagnetic wave absorption characteristics of the 0° polarization and a broken line 81 shows the electromagnetic wave absorption characteristics of the 45° polarization. In the electromagnetic wave absorber 1 in this case, the electromagnetic wave absorption is found at three bands corresponding to the respective antennas such as −3.5 dB at 1.8 GHz, −9 dB at 5.4 dB and −18 dB at 7.5 dB. When the displacements of the absorption characteristics at 45° inclination are calculated, the displacements are hardly found and thereby an improvement effect by R impartation is assuredly confirmed.

According to the configuration shown in FIGS. 17 and 18, the first substantially square pattern 31c that is a conductive pattern is provided with the void portion 75, and the void portion itself can be functioned as a receiving antenna. That is, in the substantially square pattern 31c resonant with a frequency corresponding to an external periphery length, a slot pattern (slot antenna portion) 75 resonant with a frequency corresponding to an internal periphery length can be disposed; accordingly, the substantially square pattern 31c that is one conductive pattern can resonate with a plurality (two or more) of different frequencies. Thereby, an electromagnetic wave absorber having bimodal characteristics that absorb electromagnetic waves of two frequencies respectively corresponding to an external periphery length of one conductive pattern and an internal periphery length of a slot pattern formed therein can be obtained.

Furthermore, when a plurality of slot patterns is formed in one conductive pattern and internal periphery lengths of the respective slot patterns are different from each other, an electromagnetic wave absorber having the multi-modal characteristics, in which, with one conductive pattern, electromagnetic waves of the number of the slot patterns+1 of frequencies are absorbed can be obtained. In a further repeated manner, inside of the slot pattern, another conductive pattern can be disposed and this can be corresponded to another frequency of electromagnetic wave as a resonant antenna to further increase an absorption frequency. That is, by forming one slot pattern in one conductive pattern, an electromagnetic wave absorber having multi-modal characteristics that can theoretically absorb three or more frequencies of electromagnetic wave can be obtained. In this case as well, in addition to high absorption characteristics, when corner portions of the conductive pattern are formed in curve, the polarization characteristics can be improved. When the operation is repeated, further more (four or more) frequencies of electromagnetic wave can be absorbed.

A producing method of an electromagnetic wave absorber 1 in the invention is for instance as follows. The pattern layer 5 is produced by forming a conductive pattern having a predetermined shape from an aluminum deposited PET film (film thickness=25 μm and aluminum thickness≠600 to 800 Å) by etching. The electromagnetic wave absorbing layer 4 is formed by blending 100 parts of an SBS (styrene/butadiene/styrene copolymer) resin, 340 parts of ferrite and 50 parts of carbon black, followed by kneading together with other filler, further followed by sheeting in a thickness of 0.5 mm. The dielectric layer 3 is formed by discharging inorganic and other fillers (magnetic loss material is not used) in an SBS (styrene/butadiene/styrene copolymer) resin, followed by kneading, further followed by sheeting in a thickness of 2.0 mm. The material constants of the respective layers are, after forming into a ring of ϕ7×ϕ3, measured by use of a network analyzer according to a coaxial tube method and the composition is controlled so as to obtain desired material constants. As other fillers, a flame retardant, an antiaging agent, a working additive, inorganic filler and the like are appropriately used.

The respective layers are laminated through an adhesive, followed by, after an adhering reaction comes to completion, cutting into a dimension of 50 cm×50 cm.

As ferrites, soft ferrites such as Mn—Zn ferrite, Ni—Zn ferrite, Mn—Mg ferrite and the like, or hard ferrite that is a permanent magnetic material can be cited. As iron alloys, for instance, magnetic stainless (Fe—Cr—Al—Si alloy), sendust (Fe—Si—Al alloy), permalloy (Fe—Ni alloy), silicon copper (Fe—Cu—Si alloy), Fe—Si—B(—Cu—Nb) alloy, Fe—Si—Cr alloy, Fe—Ni—Cr—Si alloy and the like can be cited. These alloys can be used in flat shape. As iron particles, for instance, carbonyl iron powder can be cited. The carbonyl iron powder is preferred to be as spherical as possible. In the case of magnetic materials, the shape, without restricting to particular one, may be appropriately selected from any one shape of bulk shape, flat shape, fibrous shape or the like. Preferably, soft ferrite powder cheap in the cost and high in the complex specific magnetic permeability can be used. When there is no magnetic loss material such as ferrite, the thinning that makes use of the complex specific magnetic permeability cannot be achieved. Furthermore, the electromagnetic wave absorbing layer 4 may be formed of a magnetic body itself. In this case, a method where a layer of a soft magnetic sintered body such as ferrite, a plated matter thereof, a metal compound or a metal oxide is formed is adopted.

Furthermore, a dielectric loss material contained in an electromagnetic wave absorbing layer 4 or, if necessary, in a dielectric layer 3 as well is an electromagnetic wave absorber that is a material selected from a group of graphite, carbon black, carbon fiber, graphite fiber, metal powder and metal fiber. The electromagnetic wave absorbing layer 4 necessarily contains a magnetic loss material. However, in order to establish the impedance matching, the electromagnetic wave absorbing layer 4 is preferably provided with appropriate complex specific permittivity. As the dielectric loss material filled in the electromagnetic wave absorbing layer 4 or if necessary in the dielectric layer 3 with the intention, carbon black such as furnace black, channel black or the like, conductive particles or fibers of stainless steel, copper, aluminum and the like, graphite, carbon fiber, graphite fiber, titanium oxide and the like can be cited. The dielectric material preferably used in the invention is carbon black, in particular, carbon black that has the nitrogen absorption specific surface area (ASTM (American Society for Testing and Materials) D3037-93) in the range of 100 to 1000 $m^2/g$ and the DBP absorption (ASTMD2414-96) in the range of 100 to 400 ml/100 g, for instance, IP1000 (trade name, produced by Showa Cabot Inc.) and Ketjen black EC (trade name, produced by Lion Aczo Co., Ltd.) can be preferably used. The DBP absorption means an absorption amount (unit: $cm^3/100$ g) of DBP (abbreviation of dibutyl phthalate) that is a kind of plasticizer.

As a material (vehicle) of an organic polymer that is used in the electromagnetic wave absorbing layer 4 and the dielectric layer 3, a synthetic resin, rubber and thermoplastic elastomer are used. For instance, polyolefins such as polyethylene, polypropylene, copolymers thereof, polybutadiene, copolymers thereof and the like, thermoplastic or thermosetting resins such as polyurethane, polyvinyl chloride, polyvinyl acetate, epoxy resin, phenol resin, melamine resin and the like and bitumen and the like can be cited. Resins having the biodegradability such as polyuric acid and the like can be used as well. The electromagnetic wave absorbing layer 4 and the dielectric layer 4 may be formed as a FRP in which glass fibers or the like are added.

The electromagnetic wave absorbing layer 4 may be one obtained by impregnating a paint or the like having the magnetic property in, other than the organic polymers, plaster material, cement material, non-woven fabric, foamed body, paper, cardboard or the like. A material in which filler can be blended can be appropriately selected as well.

The dielectric layer 3 is not restricted to one that uses an organic polymer, and, any materials, as far as these have the complex specific permittivity and do not show the electroconductivity, can be used. For instance, wood, plywood, paper, plaster, cement, clay, sand, soil, nonwoven fabric, recycle resin, nonflammable board, bitumen, asphalt, foamed body or the like can be used.

The electromagnetic wave absorbing layer 4 may combine an adhesive layer. For instance, an epoxy resin and ferrite or a dielectric loss material are blended and can be placed in the respective interfaces of the pattern layer 5, dielectric layer 3 and conductive reflective layer 2 or between the respective layers when these are used in the lamination. In this case, as mentioned above, a configuration where the electromagnetic wave absorbing layer 4 and the dielectric layer 3 are alternately and repeatedly laminated can be taken.

In this case, in order to impart the nonflammability to the electromagnetic wave absorbing layer 4 and the dielectric layer 3, predetermined amounts of a nonflammable material and a flame resistant aide are added. As the measure of the flame resistance, it is demanded to satisfy the UL94V0. As the flame retardants, without particularly restricting, phosphorus compounds, boron compounds, bromine based flame retardants, zinc based flame retardants, nitrogen based flame retardants, hydroxide based flame retardants and the like can be used in an appropriate amount. As the phosphorus compounds, phosphoric acid esters, titanium phosphate and the like can be cited. As the boron compounds, zinc borate and the like can be cited. As the bromine based flame retardants, hexabromobenzene, decabromobenzylphenyl ether, decabromobenzylphenyl oxide, tetrabromobisphenol, ammonium bromide and the like can be cited. As the zinc based flame retardants, zinc carbonate, zinc oxide, zinc borate and the like can be cited. As the nitrogen based flame retardants, triazine compounds, hindered amine compounds, melamine compounds such as melamine cyanurate and melamine guanidine compounds and the like can be cited. As the hydroxide based flame retardants, magnesium hydroxide, aluminum hydroxide and the like can be cited. When the flame resistance or the nonflammability is imparted, a PET film that is used in the pattern layer 5 or the conductive reflective layer 2 is problematic. Since, fundamentally, the PET film is difficult to render flame resistant, it is considered to cover with a nonflammable material such as char (carbonized layer). As other method, to the pattern layer 5, a configuration in which only a conductive pattern is transferred on the electromagnetic wave absorbing layer 4, followed by peeling the PET film, and, to the conductive reflective layer 2, a configuration in which in place of the PET film, a layer in which a metal foil is added to glass fiber or glass cloth is used.

In a flame resistant composition applied in the invention, for the electromagnetic wave absorbing layer 4, to a base that contains 100 (phr) of PVC as a binder, 70 (phr) of calcium carbonate and 20 (phr) of a flame retardant (trade name: Nonesan SAN-1, produced by Maruzen Petrochemical Co., Ltd.), a dispersant, a plasticizer, ferrite, graphite and the like are blended. Furthermore, for the dielectric layer 3, 100 (phr) of recycled PVC as a binder, 140 (phr) of calcium carbonate, 10 (phr) of a flame retardant (trade name: Nonesan SAN-1, produced by Maruzen Petrochemical Co., Ltd.) and the like are blended. All layers show the flame resistance corresponding to V-0 of UL94. The pattern electromagnetic wave absorber prepared with the composition satisfies a fire prevention standard as a product.

The pattern layer 5 and the conductive reflective layer 2 may be made of a metal such as gold, platinum, silver, nickel, chromium, aluminum, copper, zinc, lead, tungsten, iron and the like, a resin mixture in which in a resin, powder of the metal or conductive carbon black is mixed, a film of a conductive resin or the like. The foregoing metal or the like may be processed into a plate, sheet, film, nonwoven fabric or the like. Alternatively, a configuration where, on a synthetic resin film, a metal layer having a thickness of, for instance, 600 Å is formed may be adopted. A metal foil may be transferred on a base such as a film, cloth or the like. Furthermore, conductive ink (for instance, resistivity: 10 Ω/square or less and 0.5 Ω/square or more) may be coated on a base or the electromagnetic wave absorber 4 or the dielectric layer 3.

The electromagnetic wave absorption characteristics are measured by means of a free-space method. In the free-space method, a plane wave is illuminated on an electromagnetic wave absorber 1 that is a sample to be measured placed in a free-space, the coefficient of reflection and coefficient of transmission at this time are measured by varying a frequency, an incident angle and the polarization to obtain the complex specific permittivity and the complex specific magnetic permeability of a material. From thus obtained complex specific permittivity and specific magnetic permeability, an electromagnetic wave absorption amount (reflection loss) of the electromagnetic wave absorber 1 is calculated to obtain. At this time, measurements are carried out of TE wave, TM wave and in a state where a sample is rotated by 45°. A used measurement instrument is a network analyzer (trade name: HP8720ES, produced by Agilent Technologies Inc.) and an antenna is a double rigid antenna. Sizes of the respective sides of a rectangle of a measurement sample that is an electromagnetic wave absorber 1 are 500×500 (mm) and 1000×1000 (mm).

A surface layer 6 in FIG. 6 is may placed not only on one laminated in an order shown in FIG. 6 but also on an electromagnetic wave absorber 1 that is constituted in other order of lamination. Specific examples of the surface layer 6 include wallpaper, tile carpet, tile, flame resistant board, plywood, veneer, coated surface, resin plate, cloth, papers and the like. Fundamentally, all materials other than conductive materials having the electromagnetic wave shielding property can be laminated thereon (outside of the pattern layer). Even when these have a thickness such thin as 1 mm or less, the electromagnetic wave absorption characteristics are hardly affected. However, when these are thick or the complex specific permittivity thereof is high, redesigning is necessary to optimize the electromagnetic wave absorption characteristics. However, when these are redesigned and controlled, desired electromagnetic wave absorption characteristics can be exerted.

An intended electromagnetic wave in the invention, though determined depending on applications, is an electromagnetic wave of at least part of frequency in for instance a 900-MHz band, more specifically, an electromagnetic wave of a frequency including a range of 950 MHz or more and 956 MHz or less. A frequency of an electromagnetic wave to be shielded is as exemplified and even a configuration that shields an electromagnetic wave of a frequency other than exemplified frequency is included in the invention. The 900-MHz band means a frequency range of 880 MHz or more and less than 1000 MHz. The material constants of the respective constituent layers vary without showing the difference in the frequency range and numerical values of the invention can be used as they are.

Furthermore, in some cases, it is intended to absorb an electromagnetic wave having a frequency of a 2.4-GHz band. The 2.4-GHz band means an electromagnetic wave of 2400 MHz or more and less than 2500 MHz. Specifically, the 2.4-GHz band is an electromagnetic wave of a frequency including a range of 2400 MHz or more and 2483.5 MHz or less for RFID.

As the frequencies, as far as the frequency is in a UHF band (300 MHz to 3 GHz), an SHF band (3 GHz to 30 GHz) and an EHF band (30 GHz to 300 GHz), an arbitrary single or a plurality of frequencies can be selected. That is, the electromagnetic wave to be absorbed includes an electromagnetic wave having a frequency of 300 MHz or more and 300 GHz or less.

Finally, a pattern shape, a lamination structure and a composition of a pattern electromagnetic wave absorber having the absorption characteristics in a 950-MHz band are shown. The pattern shape has a configuration shown in FIG. 3, and, a1$x$=a1$y$=1.0 mm, a2$x$=a2$y$=17.5 mm, b1$x$=b1$y$=20.5 mm, c2$x$=c2$y$=9.0 mm, c1=1.5 mm, a curvature radius of a substantial triangular portion 22 in a radial pattern 30 R1=7.5 mm and a curvature radius at a corner portion of a substantially square pattern 31 R2=7.0 mm. In a composition of the electromagnetic wave absorbing layer 4, with a basis of 100 (phr) of PVC (trade name: KS1700, produced by Kaneka Corp.), 430 (phr) of ferrite (trade name: LD-M, produced by JFE Ferrite Co., Ltd.) and 35 (phr) of graphite (tradename: Blue P, produced by Nihon Graphite Co., Ltd.), a plasticizer, a dispersant, calcium carbonate and the like are added. As a configuration, a pattern layer (aluminum-deposited PET film), an electromagnetic wave absorbing layer 4 (2.5 mm), plywood (6.5 mm) as a dielectric layer 3 and a conductive reflective layer (aluminum-deposited PET film) are laminated.

Table 2 shows the electromagnetic wave absorption characteristics of TE wave and TM wave measured by use of a free-space method.

TABLE 2

|  | TE Wave | | | TM Wave | | |
| --- | --- | --- | --- | --- | --- | --- |
| Incident Angle | 10° | 30° | 45° | 10° | 30° | 45° |
| Absorption Frequency (GHz) | 0.95 | 0.95 | 1.00 | 0.95 | 1.05 | 1.05 |
| Peak Value of Absorption Amount (dB) | 20 | 20 | 16 | 25 | 30 | 22 |

Figure 19:
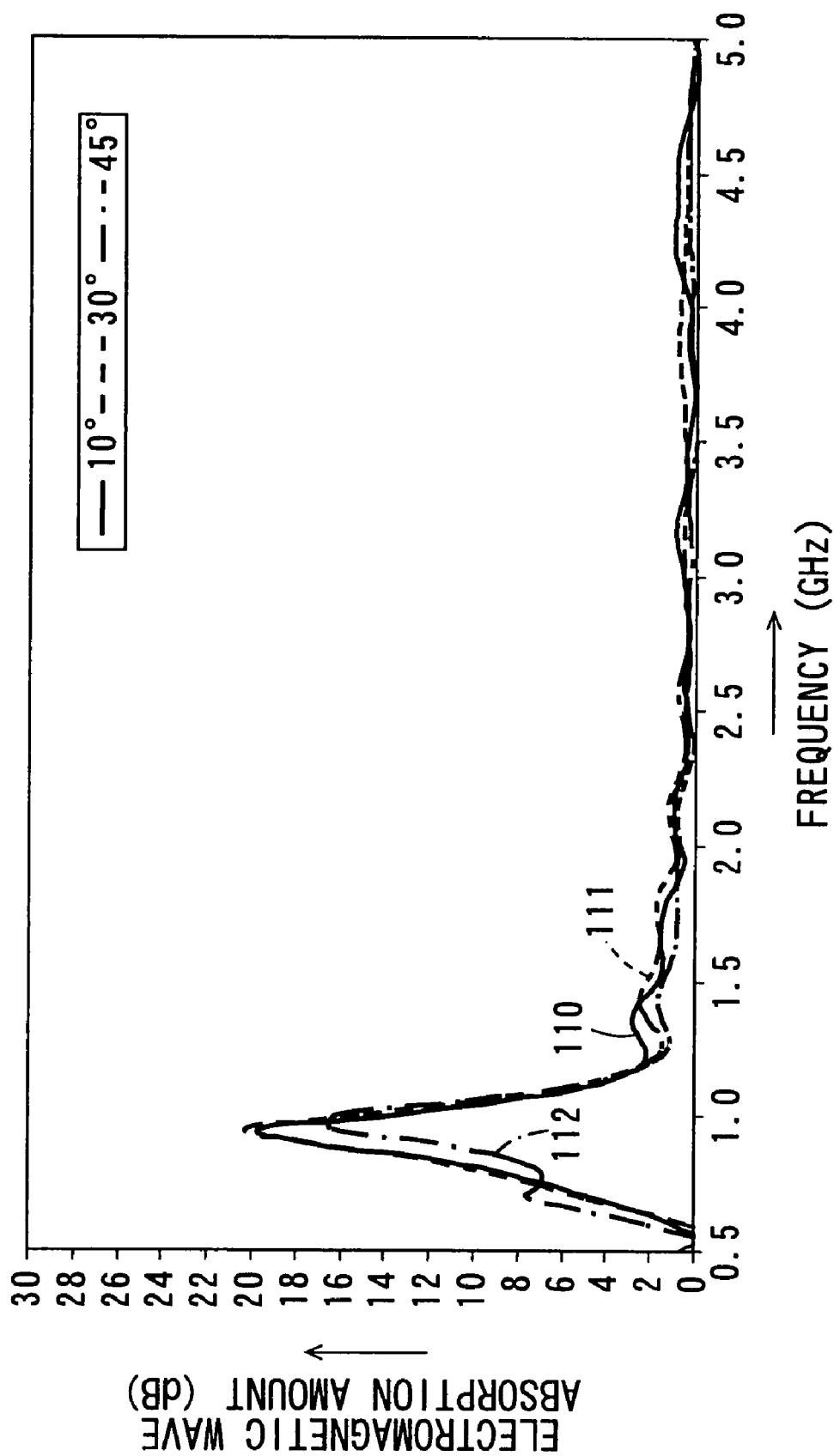
FIG. 19 is a graph of the electromagnetic wave absorption characteristics of a TE wave of an electromagnetic wave absorber having an absorption peak in a 900-MHz band as an example of the invention.
Figure 20:
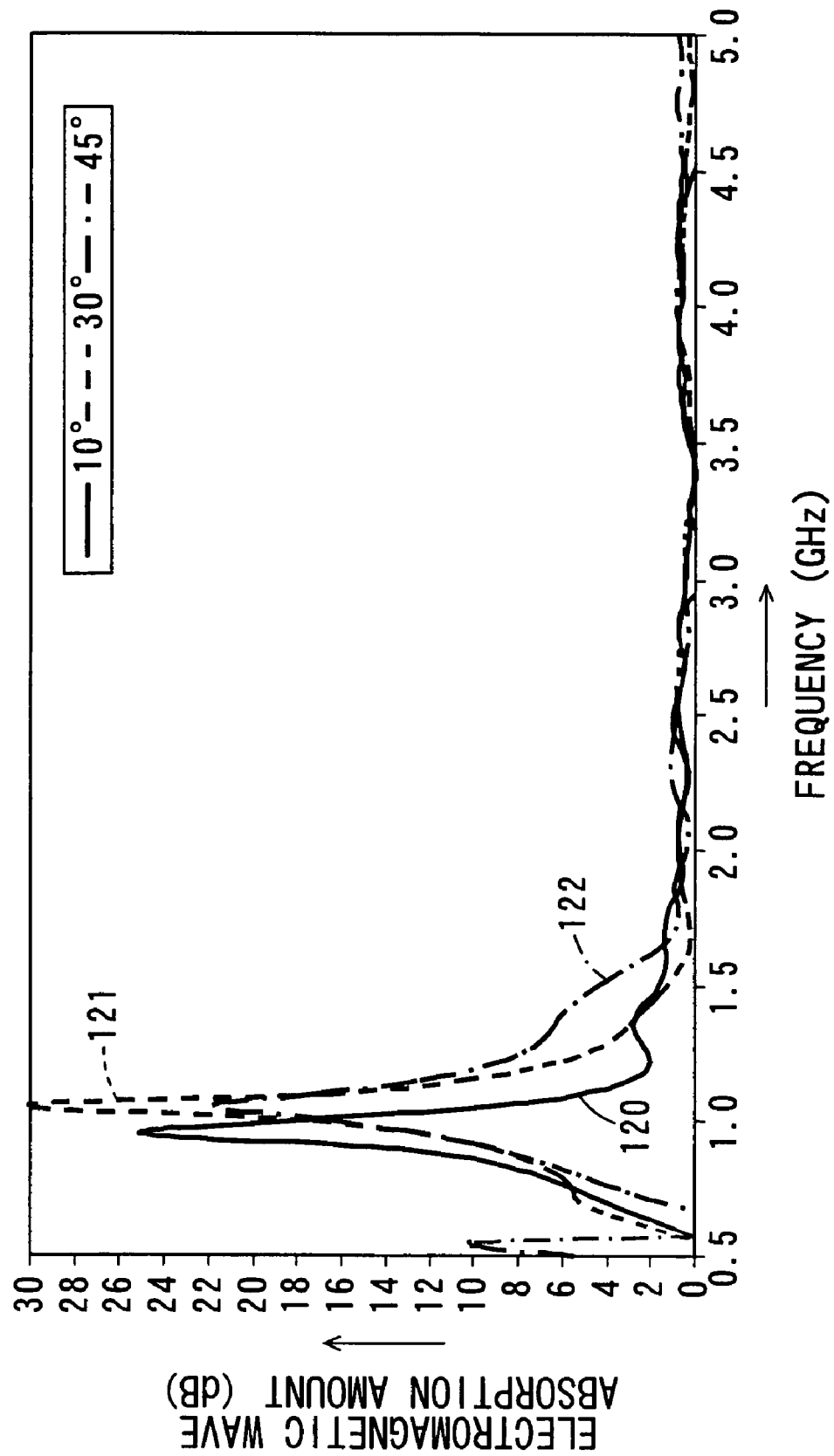
FIG. 20 is a graph of the electromagnetic wave absorption characteristics of a TM wave of an electromagnetic wave absorber having an absorption peak in a 900-MHz band as an example of the invention.

FIG. 19 is a graph showing the electromagnetic wave absorption characteristics of the TE wave measured by means of the free-space method. FIG. 20 is a graph showing the electromagnetic wave absorption characteristics of the TM wave measured by means of the free-space method. In FIG. 19, a solid line 110 shows the electromagnetic wave absorption characteristics when an incident angle is 10°, a broken line 111 shows the electromagnetic wave absorption characteristics when an incident angle is 30°, and a chain line 112 shows the electromagnetic wave absorption characteristics when an incident angle is 45°. In FIG. 20, a solid line 120 shows the electromagnetic wave absorption characteristics when an incident angle is 10°, a broken line 121 shows the electromagnetic wave absorption characteristics when an incident angle is 30°, and a chain line 122 shows the electromagnetic wave absorption characteristics when an incident angle is 45°. The electromagnetic wave absorber having the abode-mentioned configuration shows the electromagnetic wave absorption amount of 20 dB to the TE wave incident at an incident angle of, for instance, 10° and the electromagnetic wave absorption of 25 dB to the TM wave incident at an incident angle of 10°. It is found that, while showing less anisotropicity, high absorption capacity is shown. As obvious from FIGS. 19 and 20 and Table 2, when dimensions of the radial pattern 30 and substantially square pattern 31 and materials of the electromagnetic wave absorbing layer 4 are appropriately selected, an electromagnetic wave absorber 1 that absorbs an electromagnetic wave of 950 MHz can be obviously obtained.

Figure 21:
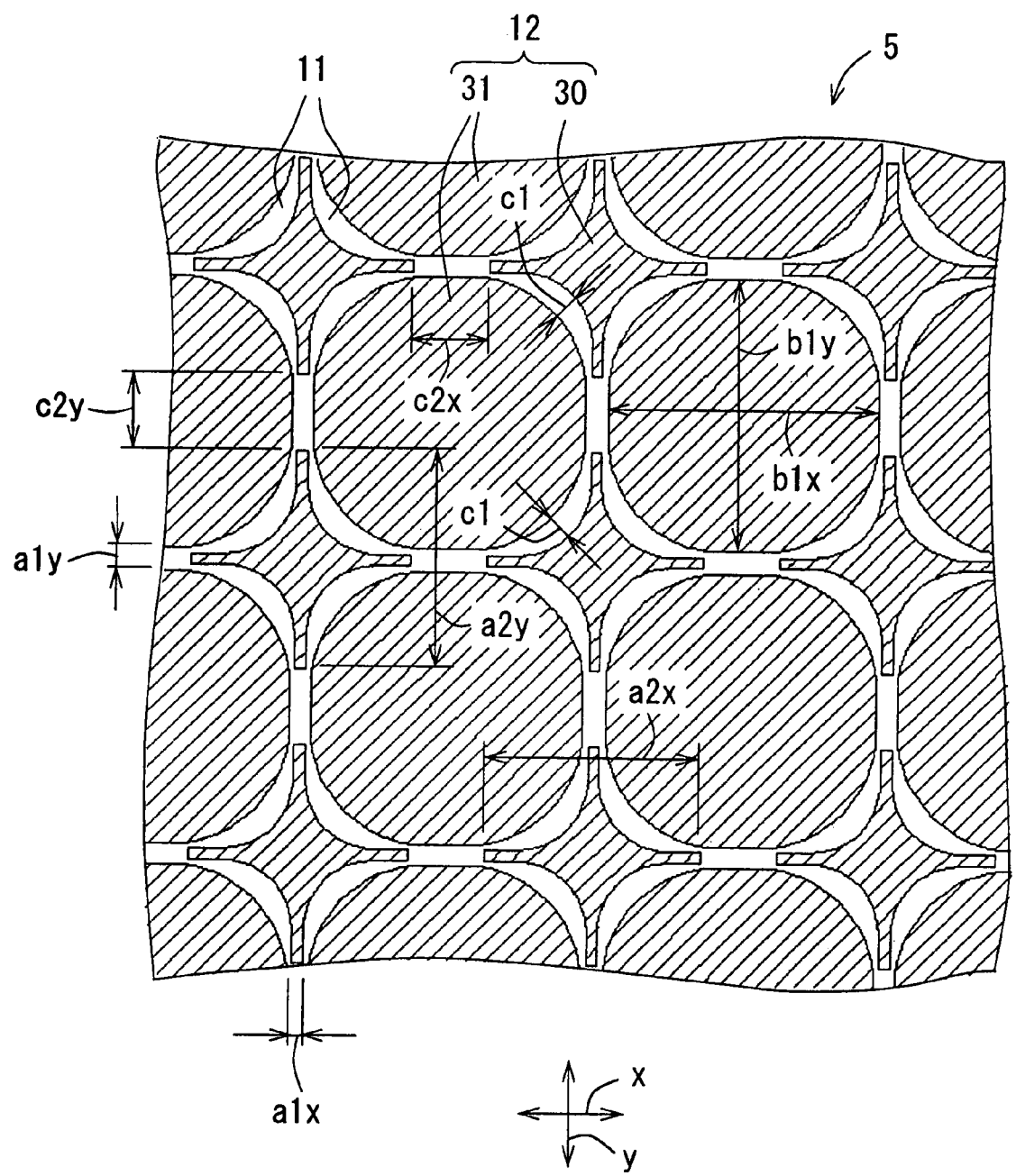
FIG. 21 is a front view showing a pattern layer 5 constituting an electromagnetic wave absorber 1 of still another embodiment of the invention.

FIG. 21 is a front view showing a pattern layer 5 that constitutes an electromagnetic wave absorber 1 of still another embodiment of the invention. FIG. 22 is a graph showing the electromagnetic wave absorption characteristics of an electromagnetic wave absorber 1 provided with the pattern layer 5 shown in FIG. 21. A pattern shape, a lamination structure and a composition of a pattern electromagnetic wave absorber having the absorption characteristics in a 950-MHz band that shows further thinning will be shown. The pattern shape is, as shown in FIG. 21, substantially same as that shown in FIG. 3 except that only dimensions are different. Corresponding portions are shown with the same reference numerals. In the embodiment, the respective curvature radii of the radial pattern 30 and substantially square pattern 31 are differentiated, and a separation c1 of two patterns 30 and 31 is continuously varied. For dimensions of a conductive pattern, a1x=a1y=1.0 mm, a2x=a2y=20.0 mm, b1x=b1y=25 mm, c2x=c2y=7.0 mm, c1=0.5 mm or more and 2.5 mm or less, a curvature radius of a substantial triangular portion 22 in a radial pattern 30 R1=6.5 mm and a curvature radius at a corner portion in a substantially square pattern 31 R2=10.5 mm are taken. A separation c1 between the radial pattern 30 and the substantially square pattern 31 is continuously varied so that, in comparison with both end portions in a direction in which the separation between the patterns 30 and 31 extends, an intermediate portion may be larger. In a composition of the electromagnetic wave absorbing layer 4, with a basis of 100 (phr) of chlorinated polyethylene (trade name: Elaslene 301NA, produced by Showa Denko K. K.) and 650 (phr) of carbonyl iron (trade name: EW-1, produced by BASF Co., Ltd.), a plasticizer, a dispersant, calcium carbonate and the like are added. As a configuration, a pattern layer (aluminum-deposited PET film), an electromagnetic wave absorbing layer 4 (1.2 mm), a dielectric layer 3 (3.2 mm) and a conductive reflective layer (aluminum-deposited PET film) are laminated. The material constants of the electromagnetic wave absorber 4 and the dielectric layer 3 at 950 MHz are as shown in Table 3 below. That is, as an electromagnetic wave absorber of a 950-MHz band, a thin type having such a thickness as 4.4 mm (1.2 mm thick as a layer having the magnetic permeability) is realized. The electromagnetic wave absorption amount by simulation is as shown in FIG. 22. In FIG. 22, a line 200 shows the electromagnetic wave absorption amount. A result of the absorption of 19.5 dB in a 925-MHz band can be obtained.

As shown in FIG. 21, a configuration where a separation c1 between the radial pattern 30 and the substantially square pattern 31 that are adjacent two conductive patterns varies depending on a position can be formed. Thereby, in comparison with a case where the separation c1 between the radial pattern 30 and the substantially square pattern 31 is constant, the electromagnetic wave absorption amount can be increased. Accordingly, when the curvature radii of the corner portions of the adjacent conductive patterns are varied and the separation between the conductive patterns is continuously varied, the absorption frequency can be shifted toward a lower frequency and the absorption amount can be increased.

Table 3 shows the material constants and thicknesses of the electromagnetic wave absorbing layers 4 and the dielectric layers 3 used in the embodiments. In Table 3, the electromagnetic wave absorbing layer 4 is simply expressed by "absorption layer".

TABLE 3

| Associated drawing | | Thickness | Material |
|---|---|---|---|
| FIG. 11 | Absorbing layer | 0.5 mm | Average value of measurements of SBS based material (5.2 GHz) |
| | Dielectric layer | 2 mm | Average value of measurements of PVC based material (5.2 GHz) |
| FIGS. 12 and 13 | Absorbing layer | 0.5 mm | Average value of measurements of SBS based material (2.4 GHz) |
| | Dielectric layer | 2 mm | Average value of measurements of PVC based material (2.4 GHz) |
| FIGS. 14 and 17 | Absorbing layer | 0.5 mm | Average value of measurements of SBS based material (2.4 GHz) |
| | | | Average value of measurements of SBS based material (5.2 GHz) |
| | Dielectric layer | 2 mm | Average value of measurements of PVC based material (2.4 GHz) |
| | | | Average value of measurements of PVC based material (5.2 GHz) |
| FIG. 16 | Absorbing layer | 0.2 mm | Average value of measurements of graphite/ferrite-blended PVC based material (2.4 GHz) |
| | Dielectric layer | 1.6 mm | Average value of measurements of graphite-blended PVC based material (2.4 GHz) |
| FIGS. 19 and 20 | Absorbing layer | 2.5 mm | Average value of measurements of graphite/ferrite-blended PVC based material (950 MHz) |
| | Dielectric layer | 6.5 mm | Average value of measurements of wood (950 MHz) |
| FIG. 21 | Absorbing layer | 1.2 | Average value of measurements of chlorinated PE/carbonyl iron based material (950 MHz) |
| | Dielectric layer | 3.2 | Average value of measurements of graphite-blended PVC based material (950 MHz) |

| Associated drawing | $\epsilon'$ | $\epsilon''$ | $\mu'$ | $\mu''$ |
|---|---|---|---|---|
| FIG. 11 | 12.2 | 1.12 | 1.02 | 0.48 |
| | 3.79 | 0.03 | 1.03 | 0.04 |
| FIGS. 12 and 13 | 12.8 | 1.18 | 1.41 | 0.43 |
| | 3.89 | 0.11 | 1.03 | 0.01 |
| FIGS. 14 and 17 | 12.8 | 1.18 | 1.41 | 0.43 |
| | 12.2 | 1.12 | 1.02 | 0.48 |
| | 3.89 | 0.11 | 1.03 | 0.01 |
| | 3.79 | 0.03 | 1.03 | 0.04 |
| FIG. 16 | 20 | 2 | 1.2 | 0.2 |
| | 6 | 0.12 | 1 | 0 |
| FIGS. 19 and 20 | 23 | 1 | 2.7 | 1.2 |
| | 2.32 | 0.3 | 1 | 0 |
| FIG. 21 | 15.1 | 0.74 | 4.6 | 1.1 |
| | 7.9 | 0.13 | 1 | 0 |

The embodiments are only examples of the invention and the configuration can be varied within a range of the invention. The invention is characteristic in forming a corner portion of a conductive pattern in curve. However, there is no need of forming corner portions of all conductive patterns in curve but only corner portions of a part of the conductive patterns may be formed in curve. Furthermore, when an angle of the conductive pattern is formed in curve, all corner portions may be formed in curve or the corner portions may be partially formed in curve.

Still furthermore, the conductive pattern may be a substantially polygonal planar shape or a linear shape of a closed-loop extending along an external peripheral border of a substantially polygon.

The electromagnetic wave absorbing layer can be configured containing at least one material selected from a group of ferrite, iron alloy and iron powder as a magnetic loss material at a blending amount of 1 parts by weight or more and 1500 parts by weight or less to 100 parts by weight of an organic polymer. When such a configuration is adopted, the loss layer can be imparted with the complex specific magnetic permeability ($\mu'$, $\mu''$) and thereby a magnetic field generated around the conductive pattern can be efficiently and energetically attenuated.

A configuration where a real part $\mu'$ of the complex specific permittivity of the dielectric layer is in the range of 1 or more and 50 or less can be formed. When thus configured, the permittivities of the dielectric layer and the electromagnetic wave absorber can be arbitrarily controlled to contribute to the miniaturization of the conductive pattern and the thinning of the electromagnetic wave absorber.

Furthermore, as an electromagnetic wave absorber for absorbing an electromagnetic wave of a 2.4-GHz band, a configuration having a total thickness of 4 mm or less can be formed. When thus configured, a conductive pattern can work as a resonant antenna to an electromagnetic wave of a 2.4-GHz band. Accordingly, the electromagnetic wave absorption efficiency in the electromagnetic wave absorber can be heightened and thereby the electromagnetic wave absorber can be thinned.

Still furthermore, as an electromagnetic wave absorber for absorbing an electromagnetic wave of a 900-MHz band, a configuration having a total thickness of 10 mm or less can be formed. When thus configured, a conductive pattern can work as a resonant antenna to an electromagnetic wave of a 900-MHz band. Accordingly, the electromagnetic wave absorption efficiency in the electromagnetic wave absorber can be heightened and thereby the electromagnetic wave absorber can be thinned.

In the invention, embodiments below can be realized.

(1) An electromagnetic wave absorber, characterized by having a configuration where a pattern layer in which a plurality of pieces of a single or plurality of kinds of conductive patterns having a substantially polygonal outline shape at least one corner portion of which is formed in curve is arranged in a non-contact state with each other; and a loss layer made of at least one of materials of a magnetic loss material having the complex specific magnetic permeability ($\mu'$, $\mu''$) and a dielectric loss material having the specific permittivity ($\in'$, $\in''$) are laminated.

An electromagnetic wave absorber excellent in the electromagnetic wave absorption characteristics can be realized. Reasons for this will be detailed below.

A thinning mechanism of an electromagnetic wave absorber that uses a conductive pattern will be described below. In the beginning, a conductive pattern of a pattern layer receives an electromagnetic wave of a particular frequency according to a resonation principle of an antenna. Here, the particular frequency is a frequency determined by various factors such as a shape and dimension of the conductive pattern and the like and a frequency to be absorbed by an electromagnetic wave absorber. When an electromagnetic wave is received by the conductive pattern, a resonant current flows in an end portion of the conductive pattern. When the current flows, a magnetic flux is generated around the current. The magnetic flux is much generated and distributes in a large magnetic flux density as nearer to a current source. When a loss layer having a magnetic loss material is disposed in the proximity of the pattern layer, magnetic energy can be lost. Thus, energy of an electromagnetic wave can be converted into thermal energy and absorbed.

Furthermore, when an electromagnetic wave absorber is mounted on an object of which surface portion is made of a conductive material or a conductive reflective layer is disposed on a side opposite to a pattern layer relative to a loss layer to use in a laminated state with the loss layer interposed between the pattern layer and the conductive layer, a capacitor can be formed between the conductive pattern of the pattern layer and the conductive layer (a surface layer of an object made of a conductive material or a conductive reflective layer). When a distance between the conductive pattern and the conductive layer is shortened, the capacitance of the capacitor can be made larger. Furthermore, between the respective patterns, a capacitor can be formed. In such a pattern electromagnetic wave absorber, by making use of a capacitor, a reactance control function can be provided to achieve the thinning.

Still furthermore, since the conductive pattern that receives an electromagnetic wave has a substantially polygonal outline shape that is fundamentally a polygon, a peak value of the electromagnetic wave absorption amount can be more heightened in comparison with a case where an outline shape of the conductive pattern is circular.

The reason for this is in that in the case of a polygonal pattern the Q value becomes higher than that of a circular pattern. At first, the Q value will be described. The Q value of the resonance can be expressed by a bandwidth. The relationship between these is expressed by Q=resonance frequency/bandwidth. Accordingly, that the Q value is higher means that the bandwidth becomes narrower.

The relationship can be expressed by applying to a peak value of the electromagnetic wave absorption amount of an electromagnetic wave absorber that uses a pattern. That is, being high in the Q value of the polygonal pattern means having a high electromagnetic wave reflection attenuation amount (peak value of electromagnetic wave absorption amount) with a narrow band, and being low in the Q value means having a low electromagnetic wave reflection attenuation amount (peak value of electromagnetic wave absorption amount) with a broad absorption band.

As a reverse of being high in the Q value of the polygonal pattern, the absorption band becomes narrower, and thereby, under an effect of the polarization the displacement of the resonant frequency is caused. This can be explained in that while, when an electric field of the 0° polarization (non-polarized state) is applied on a square-shaped (square) pattern, a strong current flows along a side of the square-shaped pattern to cause resonation there, when an electric field is tilted by 45° in the square-shaped pattern or in the case of a circular pattern, a phenomenon where a passage through which a strong current flows cannot be concentrated along a periphery so slenderly as the 0° polarization of the square-shaped pattern is caused. In other words, it can be said that when a current passage is expanded, a region where waves of half-wavelength involving the resonance distribute is expanded to result in increasing resonant conditions. It can be considered that resultantly a bandwidth can be gained. In the case of for instance a square-shaped pattern, upon receiving an electromagnetic wave (TE wave), a straight electric field is generated in parallel with a side. However, when the square-shaped pattern is rotated through 45°, an electric field in a pattern when an electromagnetic wave (TE wave) is received is generated so as to depict an arc. That is, distributions are obviously different from each other. That is, in the square-shaped (polygonal) pattern, the resonance is generated concentrated to result in higher electromagnetic wave absorption characteristics; however, there is a defect in that the polarization dependency tends to be caused.

In order to overcome the defect, a pattern shape is formed in one that is fundamentally a polygon and at least one corner portion of which is formed in curve. Here, an advantage of imparting R to the corner portion, that is, forming in curve is to make a resonant current flow easily at a corner portion and to expand a resonant region. Thereby, although the Q value is a little deteriorated, broadband performance can be exhibited to improve the polarization characteristics. Thereby, displacement in a frequency where the absorption amount becomes a peak depending on a direction of the polarization of an electromagnetic wave can be suppressed small. Accordingly, an electromagnetic wave absorber high in a peak value in the absorption amount of the electromagnetic wave, small in the displacement of a frequency where the absorption amount becomes a peak depending on a direction of the polarization of the electromagnetic wave, that is, excellent in the electromagnetic wave absorption characteristics can be realized.

The conductive pattern may be a substantially polygonal planar shape or a linear shape of a closed loop extending along an external peripheral border of the substantially polygonal shape.

When at least part of corner portions of a fundamentally polygonal shape is formed in curve, an electromagnetic wave absorber high in a peak value in the absorption amount of the electromagnetic wave, small in the displacement of a frequency where the absorption amount becomes a peak depending on a direction of the polarization of the electromagnetic wave, that is, excellent in the electromagnetic wave absorption characteristics can be realized.

(2) An electromagnetic wave absorber characterized in that a dimension of a portion formed in curve in the corner portion is determined at a small dimension in a range of a dimension that can suppress a frequency that can be absorbed from displacing by difference of a direction of the polarization.

A portion that is formed in curve at a corner portion can be made as small as possible. Thereby, while suppressing a frequency where an absorption amount becomes a peak depending on the polarization direction of the electromagnetic wave from displacing, a peak value of the absorption amount of the electromagnetic wave can be made as high as possible. That is, when the curvature radius R of a curve at the corner portion becomes larger, the pattern shape approaches a circle to be finally a circle. The Q value decreases accordingly and the electromagnetic wave absorption characteristics tend to deteriorate; however, the polarization characteristics are improved. In the invention, a pattern shape where a magnitude of the curvature radius R is optimized so as to make the electromagnetic wave absorption characteristics higher and the polarization characteristic more excellent is formed. Accordingly, an electromagnetic wave absorber very excellent in the electromagnetic wave absorption characteristics can be realized.

In the invention, with a frequency where the absorption amount becomes a peak depending on a direction of the polarization suppressed from displacing, a peak value of the absorption amount of the electromagnetic wave can be made as high as possible.

(3) An electromagnetic wave absorber characterized in that a conductive pattern is a planar pattern.

When the electromagnetic wave absorber is mounted on an object a surface of which is made of a conductive material and used, or when a conductive reflective layer is further disposed to use in a laminated state where the pattern layer is laminated on the conductive layer, a capacitor can be formed between the conductive pattern of the pattern layer and the conductive layer. Furthermore, since the pattern is planar, the capacitance of the capacitor can be made larger. A planar conductive pattern can readily form a capacitor large in the capacitance and a reactance control function that is effective in the thinning of the electromagnetic wave absorber that uses the conductive pattern can be effectively utilized.

The receiving efficiency of the electromagnetic wave due to the conductive pattern can be made higher and the absorption amount of the electromagnetic wave in the electromagnetic wave absorber can be heightened.

(4) An electromagnetic wave absorber characterized in that conductive patterns are combined to absorb electromagnetic waves of two or more frequencies.

A conductive pattern works as a resonant antenna to an electromagnetic wave having a particular wavelength. In the case of a planar pattern, an outer periphery length is designed so as to correspond to a wavelength of the particular frequency. Then, when a plurality of kinds of pattern sizes that correspond to two or more frequencies of electromagnetic wave is arranged, an electromagnetic wave absorber having the bimodal characteristics that absorb electromagnetic wave having at least two frequencies can be realized. In the case, not only the absorption characteristics can be heightened but also, when a corner portion of a pattern shape is formed in curve, the polarization characteristics can be improved.

When pattern shapes are combined, a plurality of frequencies of electromagnetic wave can be made receivable and at least two electromagnetic waves can be absorbed.

(5) An electromagnetic wave absorber characterized in that the conductive pattern has at least one void portion and the void portion resonates with an electromagnetic wave of a frequency to be absorbed.

For instance, when a void portion is disposed inside of a planar pattern, the void portion itself can be worked as a receiving antenna. That is, inside of a planar pattern that is a resonant patch antenna, a slot pattern (slot antenna) can be disposed. Thereby, an electromagnetic wave absorber having the bi-modal characteristics that can absorb electromagnetic waves of two frequencies can be obtained. When a planar pattern is disposed further repeatedly inside of the slot pattern, this can be corresponded as a resonant antenna to an electromagnetic wave having a separate frequency, and thereby an electromagnetic wave absorber having the multimodal characteristics that can theoretically absorb electromagnetic waves having three frequencies can be obtained. In this case as well, not only the absorption characteristics can be heightened but also, when a corner portion of a pattern shape is formed in curve, the polarization characteristics can be improved. By further repeating the operation, an electromagnetic wave of further many frequencies (four or more) can be absorbed.

When a void portion is formed in a conductive pattern, an electromagnetic wave having a plurality of frequencies can be made receivable and at least two electromagnetic waves can be absorbed.

(6) An electromagnetic wave absorber characterized in that the loss layer includes:

an electromagnetic wave absorbing layer made of a material that is at least one of a magnetic loss material and a dielectric loss material; and a dielectric layer made of a dielectric material.

The absorption of the electromagnetic wave in the loss layer can be improved. Accordingly, the electromagnetic wave absorption efficiency in the electromagnetic wave absorber can be heightened and thereby the electromagnetic wave absorber can be thinned.

The absorption of the electromagnetic wave in the loss layer can be improved and the electromagnetic wave absorption amount can be heightened.

(7) An electromagnetic wave absorber characterized in that an electromagnetic wave absorbing layer and a dielectric layer, respectively, have the surface resistivity of $10^6$ Ω/square or more.

The surface resistivities (in accordance with JIS K6911) of the electromagnetic wave absorbing layer and the dielectric layer are sufficiently higher than a level that is called the electroconductivity ($10^{-4}$ to $10^1$ Ω/square) and the layers do not have the electromagnetic wave shielding property. As the result, an electromagnetic wave of a particular frequency can be efficiently taken inside and converted to thermal energy.

The electromagnetic wave, without being reflected, can be preferably absorbed.

(8) An electromagnetic wave absorber characterized in that at least one of an electromagnetic wave absorbing layer and a dielectric layer is formed in a plurality of layers.

A case where the electromagnetic wave absorbing layer and the dielectric layer are constituted as a laminated body as well as a case where an electromagnetic wave absorbing layer and a dielectric layer are alternately laminated is supposed. For instance, when, as a dielectric layer, a thin plate of an nonflammable board, a thermosetting resin, flame retardant paper or a plywood is used, when, as an electromagnetic wave absorbing layer, an adhesive layer where a magnetic loss material is blended in an adhesive resin is used, and when the adhesive layer is coated thick to obtain a necessary thickness thereof, a dedicated unit becomes necessary to result in the cost increase. Even when thin layers are formed into a multilayer, an advantage as an electromagnetic wave absorbing layer can be obtained; accordingly, when an existing unit is used to form thin layers, followed by alternately laminating to increase the number of lamination, a new dedicated unit becomes unnecessary.

When the respective layers are formed in a multilayer, an existing unit can be used to produce at the low cost.

(9) An electromagnetic wave absorber characterized in that a conductive reflective layer is laminated on a side opposite to a pattern layer with respect to a loss layer.

A place where an electromagnetic wave absorber is disposed is less restricted. For instance, the electromagnetic wave absorber can be mounted on an object a surface of which is made of a non-conductive material to use to absorb the electromagnetic wave. Accordingly, the convenience is improved.

That is, an electromagnetic wave absorber high in the convenience can be obtained.

(10) An electromagnetic wave absorbing method, characterized by using the electromagnetic wave absorber.

When an electromagnetic wave absorber excellent as mentioned above is used, an electromagnetic wave can be preferably absorbed.

When the electromagnetic wave absorbers according to the invention are disposed, as specific applications, as a floor material, a wall material or a ceiling material that forms an electromagnetic wave environmental space such as offices, or a covering material of a metal surface of furniture or business machines, a partition or the like, an electromagnetic wave environment can be improved. Specifically, prevention of electronic machines (medical machines) from malfunctioning due to the self-interference or the interference with other waves, protection of human bodies, countermeasures for transmission delay such as wireless LAN (2.4 GHz, 4.9 GHz, 5.2 GHz and the like), DSRC and ETC (5.8 GHz) and the like and countermeasures for preservation of electromagnetic wave transmission environments can be cited. Furthermore, an improvement in an electromagnetic wave transmission environment of wireless transmission between ITS-related mobile objects that uses an electromagnetic wave of a millimeter waveband can be cited as well. As to the electromagnetic wave environment, without restricting to offices, general households, hospitals, concert halls, factories, research facilities, station houses, exhibition halls and outdoor facilities such as road sidewalls and the like can be cited. In walls, floors, ceilings, pillars, panels, billboards, steel products and the like in the respective conceivable environments, every necessary portions can be available.

AS mentioned above, with the excellent electromagnetic wave absorber, electromagnetic waves can be preferably absorbed.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

INDUSTRIAL APPLICABILITY

According to the invention, an electromagnetic wave absorber excellent in the electromagnetic wave absorption characteristics can be realized. In the electromagnetic wave absorber, at first, a conductive pattern of a pattern layer receives an electromagnetic wave of a particular frequency according to a resonation principle of an antenna. Here, the particular frequency is a frequency determined by various factors such as a shape and a dimension of the conductive pattern and the like and a frequency to be absorbed by an electromagnetic wave absorber. Since a loss layer is disposed laminated on the pattern layer having the conductive pattern that receives an electromagnetic wave, energy of the received electromagnetic wave can be lost with the loss layer. Thus, the electromagnetic wave can be absorbed.

Furthermore, the conductive pattern that receives the electromagnetic wave is formed into an outline shape having a substantially polygonal shape that is fundamentally a polygon and has at least one corner portion thereof formed in curve. When the corner portion is formed with R, that is, in curve, a displacement of a frequency where an electromagnetic wave absorption amount (hereinafter, in some cases, simply referred to as "absorption amount") becomes a peak value depending on the polarization direction of the electromagnetic wave can be suppressed small to improve the polarization characteristics. Accordingly, an electromagnetic wave absorber that is high in the peak value of the absorption amount of the electromagnetic wave and small in the displacement of the frequency where the absorption amount becomes a peak value depending on the polarization direction of the electromagnetic wave, that is, excellent in the electromagnetic wave absorption characteristics can be realized.

The pattern layer may have a configuration where all conductive patterns have a curved corner portion or a configuration where all conductive patterns do not necessarily have a curved corner portion. That is, a configuration where a part of conductive patterns have a curved corner portion may be adopted. When a part of the conductive patterns have a curved corner portion, other conductive patterns are not restricted in whether these have a curved corner portion or not. Furthermore, in the conductive pattern having a curved corner portion, only a part of the corner portions may be formed in curve or all corner portions may be formed in curve. Still furthermore, the conductive pattern may be a substantially polygonal planar shape or a linear shape of a closed loop extending in a substantial polygon.

In addition, a portion formed in curve at a corner portion can be formed as small as possible. Thereby, while suppressing a frequency where an absorption amount becomes a peak depending on the polarization direction of the electromagnetic wave from displacing, a peak value of the absorption amount of the electromagnetic wave can be made as high as possible. That is, a pattern shape where a magnitude of the curvature radius R is optimized so that a peak value of absorption amount of electromagnetic wave may be high and the polarization characteristics may be improved is formed. Accordingly, an electromagnetic wave absorber very excellent in the electromagnetic wave absorption characteristics can be realized.

According to the invention, there is provided the conductive pattern in which the outline shape is a shape formed by a combination of a straight line and a curve. In a case where the corner portion is simply formed in a curved shape, when the whole corner portion is formed by a curve, the polarization characteristics become good, but a peak value of absorption amount become low. Therefore, by having a shape formed by a combination of a straight line and a curve, it is possible to realize an electromagnetic wave absorber having excellent electromagnetic wave absorption characteristics that absorber has high peak value of absorption amount of an electromagnetic wave and is small in displacement between frequencies where peaks of absorption amount are reached, which displacement is caused by difference of polarization directions of electromagnetic waves.

According to the invention, there is provided the conductive pattern which is a shape in which four corner portions of a square are each formed in an arc shape. Such a shape in which the corner portions of the square are formed in an arc shape is a concrete shape having a characteristic that a peak value of absorption amount of an electromagnetic wave becomes high and a characteristic that is small in displacement between frequencies where peaks of absorption amount are reached, which displacement is caused by difference of polarization directions of electromagnetic waves. Therefore, it is possible to specifically realize an electromagnetic wave absorber having excellent electromagnetic wave absorption characteristics that absorber has conflicting characteristics mentioned above.

According to the invention, when an electromagnetic wave absorber is mounted on an object of which surface is made of a conductive material or a conductive reflective layer is further disposed to use in a state where the pattern layer is laminated on the conductive layer, a capacitor can be formed between the conductive pattern of the pattern layer and the conductive layer. Furthermore, since the pattern is formed in plane, a capacitance of a capacitor can be made larger. The planar conductive pattern tends to readily form a capacitor having a large capacitance. When the capacitor is formed, the reactance can be controlled, and thereby an electromagnetic wave absorber that uses the conductive pattern can be thinned.

According to the invention, a conductive pattern works as a resonant antenna to an electromagnetic wave having a particular wavelength. A conductive pattern is designed so that an outer periphery length may correspond to a wavelength of a particular frequency. Accordingly, when conductive patterns different in outer periphery length are formed, the conductive patterns resonate with frequencies of two or more electromagnetic waves corresponding to the respective outer periphery lengths. Thereby, an electromagnetic wave absorber having the multi-modal characteristics that absorb electromagnetic wave having at least two frequencies of electromagnetic waves can be realized. In the case as well, not only the absorption characteristics can be heightened but also, when a corner portion of a pattern shape is formed in curve, the polarization characteristics can be improved.

According to the invention, when conductive patterns different in the curvature radii at corner portions are formed, in comparison with a case where only conductive patterns same in the curvature radii at the corner portions are formed, without lowering the peak value of an absorption amount of electromagnetic wave, a frequency band of the electromagnetic wave to be absorbed (hereinafter, in some cases, referred to as "absorption band") can be altered. The alteration of the absorption band includes expanding the absorption band and alteration of the absorption frequency. For instance, when the curvature radii at corner portions of adjacent conductive patterns are a little differentiated, without lowering the peak value of the absorption amount of the electromagnetic wave absorber, the absorption band can be expanded. Furthermore, for instance, when the curvature radii at corner portions of adjacent conductive patterns are a little largely differentiated, without lowering the peak value of the absorption amount of the electromagnetic wave absorber, a frequency (hereinafter, in some cases, referred to as "absorption frequency") of the electromagnetic wave to be absorbed can be lowered.

According to the invention, in comparison with a case where a separation between two adjacent conductive patterns is formed with a definite value, an absorption amount of the electromagnetic wave can be made larger.

According to the invention, a void portion is disposed in the conductive pattern and the void portion itself can be functioned as an antenna. That is, to the conductive pattern resonant with a frequency corresponding to an outer periphery length, a slot pattern (slot antenna) resonant with a frequency corresponding to an inner periphery length can be disposed to enable to resonate with a plurality (two or more) of different frequencies. Thereby, an electromagnetic wave absorber having the multi-modal characteristics that can absorb electromagnetic waves of at least two frequencies can be obtained. By further repetition, another conductive pattern can be disposed inside of the slot pattern and this can be corresponded as a resonant antenna to an electromagnetic wave having a separate frequency, and thereby an electromagnetic wave absorber having the multi-modal characteristics that can absorb theoretically electromagnetic waves having three or more frequencies can be obtained. In this case as well, not only the absorption characteristics can be heightened but also, when a corner portion of a pattern shape is formed in curve, the polarization characteristics can be improved. By further repeating the operation, electromagnetic waves of further many frequencies (four or more) can be absorbed.

According to the invention, the loss layer can be improved in the absorption of the electromagnetic wave. Accordingly, the electromagnetic wave absorption efficiency in the electromagnetic wave absorber can be improved and thereby the electromagnetic wave absorber can be thinned.

According to the invention, the loss layer can be provided with the complex specific magnetic permeability ($\mu'$, $\mu''$). Accordingly, a magnetic field generated around a conductive pattern can be efficiently energetically attenuated.

According to the invention, the permittivities of the dielectric layer and the electromagnetic wave absorber can be arbitrarily controlled and thereby the miniaturization of the conductive pattern and the thinning of the electromagnetic wave absorber can be achieved.

According to the invention, the surface resistivities (in accordance with JIS K6911) of the electromagnetic wave absorbing layer and the dielectric layer are sufficiently higher than a level that is called the electroconductivity ($10^{-4}$ to $10^{1}$ $\Omega$/square) and the layers do not have the electromagnetic wave shielding property. As the result, an electromagnetic wave of a particular frequency can be efficiently taken inside and can be converted to thermal energy. Furthermore, the electromagnetic wave, without being reflected, can be preferably absorbed.

According to the invention, a case where an electromagnetic wave absorbing layer and a dielectric layer are constituted as a laminated body as well as a case where an electromagnetic wave absorbing layer and a dielectric layer are alternately laminated is supposed. For instance, when, as the dielectric layer, a thin plate of an nonflammable board, a thermosetting resin, flame resistant paper or a plywood is used, and, as an electromagnetic wave absorbing layer, an adhesive layer where a dielectric loss material is blended in an adhesive resin is used, in order to coat the adhesive layer thick to obtain a necessary thickness thereof, a dedicated unit becomes necessary to result in the cost increase. Even when thin layers are formed into a multilayer, an advantage as an electromagnetic wave absorbing layer can be obtained; accordingly, when an existing unit is used to form thin layers, followed by alternately laminating to increase the number of alternate lamination, a new dedicated unit becomes unnecessary. When the respective layers are formed in a multilayer of thin layers, an existing unit can be used to produce at the low cost.

According to the invention, a conductive pattern can function as a resonant antenna with an electromagnetic wave of a 2.4-GHz band. Accordingly, the electromagnetic wave absorption efficiency in the electromagnetic wave absorber can be heightened and the electromagnetic wave absorber can be formed thinner.

According to the invention, a conductive pattern can function as a resonant antenna with an electromagnetic wave of a 900-MHz band. Accordingly, the electromagnetic wave absorption efficiency in the electromagnetic wave absorber can be heightened and the electromagnetic wave absorber can be formed thinner.

According to the invention, there is less restriction on a where to dispose the electromagnetic wave absorber. For instance, the electromagnetic wave absorber can be mounted on an object a surface of which is made of a non-conductive material to absorb the electromagnetic wave. Accordingly, the convenience can be improved.

According to the invention, the flame resistance or the nonflammability can be imparted to the electromagnetic wave absorber that is a laminated body. In order to impart the flame resistance or the nonflammability to the electromagnetic wave absorber as a laminated body, the flame resistance or the nonflammability may be imparted to, for instance, at least one layer of the electromagnetic wave absorbing layer and the absorbing layer to realize. When the flame resistance or the nonflammability is thus imparted to the electromagnetic wave absorber, the electromagnetic wave absorber can be preferably used as interior materials and materials that constitute the interior materials.

According to the invention, by using an electromagnetic wave absorber excellent as mentioned above, an electromagnetic wave can be preferably absorbed.

Specific applications of the electromagnetic wave absorbers according to the respective inventions include, though only as an example, a floor material, a wall material and a ceiling material that form an electromagnetic wave environmental space such as offices, or a covering material of a metal surface of furniture and business machines, a partition or the like. When the electromagnetic wave absorbers according to the inventions are disposed to these applications, electromagnetic wave environments can be improved. Further specifically, the electromagnetic wave absorbers can be used to inhibit electronic machines (medical machines) from mal-functioning due to the self-interference or the interference with other waves and to protect human bodies from electromagnetic waves. Furthermore, the electromagnetic wave absorbers can be used as countermeasures for transmission delay, for preservation of electromagnetic wave transmission environments in wireless LAN (2.4 GHz, 4.9 GHz, 5.2 GHz and the like), IC tags (950-MHz band and 2.4-GHz band), DSRC and ETC (5.8 GHz) and marine lasers (9.4 GHz and 3 GHz) and the like and for inhibition of laser pseudo-image. Furthermore, an electromagnetic wave transmission environment of wireless transmission between ITS-related mobile objects that use an electromagnetic wave of a millimeter waveband can be improved as well. Examples of the electromagnetic wave environments include, without restricting to the offices, general households, hospitals, concert halls, factories, research facilities, station houses, exhibition halls, and outdoor facilities such as road sidewalls, ships, airplanes, containers, trucks, warehouses, distribution centers, department stores, parking lots, gasoline stands, convenience stores, stores and the like. The electromagnetic wave absorber can be used in every necessary portions such as walls, floors, ceilings, pillars, panels, billboards, steel products, desks, partitions, shelves, supports, instruments, metallic members and the like in the respective conceivable environment. The specific applications are only examples thereof and the invention, without restricting to the applications, can be widely used in all applications where the electromagnetic wave is intended to absorb.

The invention claimed is:

1. An electromagnetic wave absorber comprising:
a pattern layer in which a plurality of pieces of conductive patterns including a single or plurality of kinds of conductive patterns having a substantially polygonal outline shape in which at least one corner portion is shaped in curve is formed in a mode where the plurality of conductive patterns are separated from each others; and
a loss layer having a portion made of at least one material of a magnetic loss material having complex specific magnetic permeability and a dielectric loss material having complex specific permittivity,
the pattern layer and the loss layer being laminated on each other, and
a portion, formed in curve in the corner portion, being formed with a dimension in which frequencies where peaks of absorption amount are reached are fixed regardless of an angle position relationship of the conductive pattern with respect to a polarization direction as viewed from an incident direction of electromagnetic direction, the dimension being small.

2. The electromagnetic wave absorber of claim 1, wherein the outline shape is a shape formed by a combination of a straight line and a curve.

3. The electromagnetic wave absorber of claim 1, wherein the substantially polygonal shape is a shape in which four corner portions of a square are each formed in an arc shape.

4. The electromagnetic wave absorber of claim 1, wherein the conductive pattern is a planar pattern.

5. The electromagnetic wave absorber of claim 1, wherein conductive patterns different in outer peripheral length are combined to form.

6. The electromagnetic wave absorber of claim 1, wherein conductive patterns different in curvature radius at corner portions are combined to form.

7. The electromagnetic wave absorber of claim 1, wherein a separation between two adjacent conductive patterns is different depending on a position.

8. The electromagnetic wave absorber of claim 1, wherein the conductive pattern has a single or plurality of void portions and the void portion resonates with an electromagnetic wave of a frequency to be absorbed.

9. The electromagnetic wave absorber of claim 1, wherein the loss layer includes:
   an electromagnetic wave absorbing layer made of a material that is at least either a magnetic loss material or a dielectric loss material; and
   a dielectric layer made of a dielectric material.

10. The electromagnetic wave absorber of claim 9, wherein the electromagnetic wave absorbing layer includes as a magnetic loss material at least one selected from a group consisting of ferrite, iron alloy and iron powder at a blending ratio of 1 parts by weight or more and 1500 parts by weight or less to 100 parts by weight of an organic polymer.

11. The electromagnetic wave absorber of claim 9, wherein a real part of the complex specific permittivity of the dielectric layer is in the range of 1 or more and 50 or less.

12. The electromagnetic wave absorber of claim 9, wherein the electromagnetic wave absorbing layer and the dielectric layer, respectively, are $10^6$ Ω/square or more in the surface resistivity.

13. The electromagnetic wave absorber of claim 9, wherein at least either the electromagnetic wave absorbing layer or the dielectric layer is obtained by laminating a plurality of layers.

14. The electromagnetic wave absorber of claim 1, wherein the electromagnetic wave absorber is an electromagnetic wave absorber for absorbing an electromagnetic wave of 2.4-GHz band, and a total thickness of the electromagnetic wave absorber is 4 mm or less.

15. The electromagnetic wave absorber of claim 1, wherein the electromagnetic wave absorber is an electromagnetic wave absorber for absorbing an electromagnetic wave of 900-MHz band, and a total thickness of the electromagnetic wave absorber is 10 mm or less.

16. The electromagnetic wave absorber of claim 1, wherein a conductive reflective layer is laminated on a side opposite to the pattern layer with respective to the loss layer.

17. The electromagnetic wave absorber of claim 1, wherein the electromagnetic wave absorber is flame resistant and non-flammable.

18. An electromagnetic wave absorbing method that uses the electromagnetic wave absorber of claim 1.

* * * * *